United States Patent
Itou et al.

(10) Patent No.: US 7,092,470 B2
(45) Date of Patent: Aug. 15, 2006

(54) DATA TRANSFER METHOD, BLOCK SYNCHRONIZING SIGNAL DETECTING METHOD, AND REPRODUCING APPARATUS

(75) Inventors: Akira Itou, Tokyo (JP); Toshihiko Hirose, Kanagawa (JP)

(73) Assignee: Sony Corporation, Tokyo (JP)

( * ) Notice: Subject to any disclaimer, the term of this patent is extended or adjusted under 35 U.S.C. 154(b) by 532 days.

(21) Appl. No.: 10/363,908

(22) PCT Filed: Jul. 9, 2002

(86) PCT No.: PCT/JP02/06963

§ 371 (c)(1),
(2), (4) Date: Mar. 7, 2003

(87) PCT Pub. No.: WO03/007299

PCT Pub. Date: Jan. 23, 2003

(65) Prior Publication Data
US 2003/0174781 A1    Sep. 18, 2003

(30) Foreign Application Priority Data
Jul. 9, 2001    (JP)    .............................. 2001-208496

(51) Int. Cl.
*H04L 25/38* (2006.01)

(52) U.S. Cl. ...................... 375/369; 375/362; 375/341; 375/262; 375/265

(58) Field of Classification Search ................ 375/262, 375/263, 265, 341, 362, 369; 714/798, 795, 714/792
See application file for complete search history.

(56) References Cited

U.S. PATENT DOCUMENTS

| 6,032,284 A * | 2/2000 | Bliss ........................ 714/792 |
| 6,347,390 B1 * | 2/2002 | Ino ............................ 714/792 |
| 6,532,567 B1 * | 3/2003 | Ino ............................ 714/798 |

FOREIGN PATENT DOCUMENTS

| JP | 9-231692 | 9/1997 |
| JP | 2000-124815 | 4/2000 |
| JP | 2000-260131 | 9/2000 |

* cited by examiner

*Primary Examiner*—Phuong Phu
(74) *Attorney, Agent, or Firm*—Frommer Lawrence & Haug LLP

(57) ABSTRACT

There is provided a method of detecting a block sync signal in which a sync signal and code sequence can be distinguished from each other to recognize the head of a block composed of a plurality of code words at the time of data reading or reception. A sync word detector (10) is supplied with a window signal Sync_window generated based on a parity OK signal supplied from a parity check circuit (12) and indicating a period between the sync word included in signal read from the medium (1) and the ID information, and detects the sync word as to a bit string detected by a PRML Viterbi detector (6) with the use of the Sync_window signal.

12 Claims, 13 Drawing Sheets

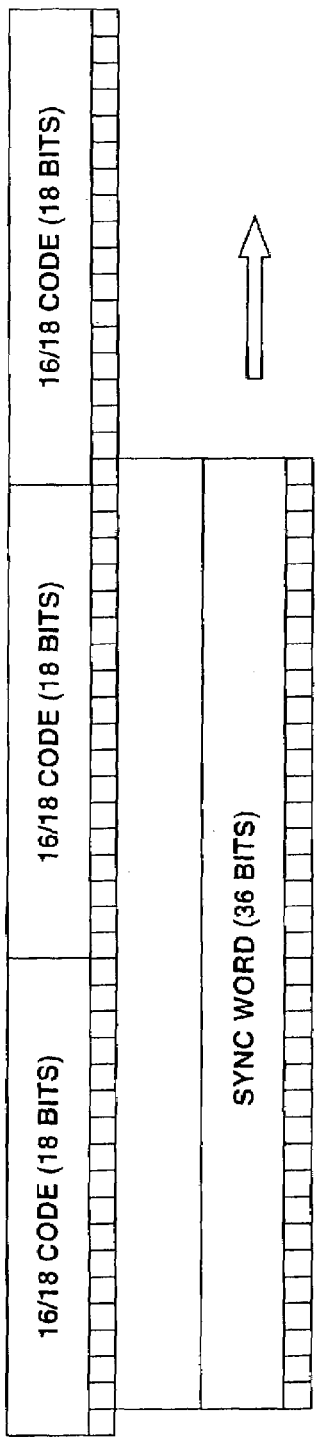
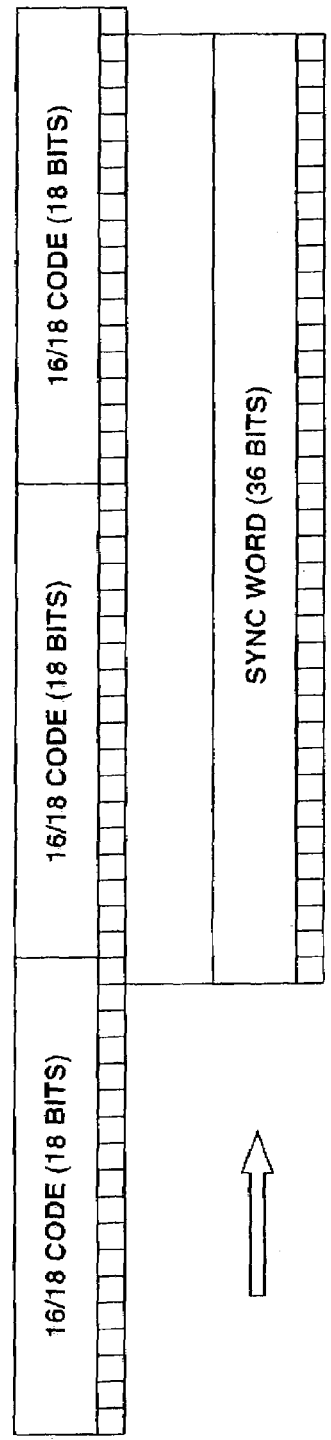
FIG.8A
FIG.8B

DATA TRANSFER METHOD, BLOCK SYNCHRONIZING SIGNAL DETECTING METHOD, AND REPRODUCING APPARATUS

TECHNICAL FIELD

The present invention generally relates to a data transmission method, block sync signal detection method and a player, and more particularly to a data transmission method, block sync signal detection method and a player, suitable for transmitting, or recording to a recording medium, data encoded suitably for the transmission or recording and to which a block sync signal is added, and detecting a code sequence including the block sync signal in the received data or data read from the recording medium.

BACKGROUND ART

Normally, a block sync signal is added to the head of a data block going to be transmitted or recorded. At the time of data reception or reading, the sync signal is detected to recognize the head of the block. The "block" referred to herein is a unit consisting of a plurality of data words or code words. For example, a block in DAT (digital audio tape) is composed of 36 symbols in total including 2 symbols of ID (identity) data, 1 symbol of ID parity and 32 symbols of data word. One symbol is of 8 bits before encoded with an eight-to-ten (8/10) code that is a recording code while it is of 10 bits after encoded with the recording code. For recording, each 8-bit symbol forming a block is first encoded with the 8/10 code and then a sync signal (sync word) of 1 symbol (10 bits), not existent in the sequence of the 8/10 code, is added to the head of the block. For reading, the head of the block is recognized by detecting the sync word and then the encoded ID data, parity and 32-symbol data word are decoded symbol by symbol. The 8/10 code is intended for use with data recorded by the NRZI (non-return-to-zero-inverted) recording method. However, a maximum length of a succession of same bits in an NRZI-converted sequence (will be referred to as "Tmax" hereunder) is 4 and Tmax will not continuously repeat more than 2 times. A sync word includes a pattern in which Tmax not appearing in any code sequence continuously repeated 2 times, whereby the sync word can be distinguished from the code sequence.

Recently, the TCPR (trellis-coded partial response) method has been studied actively in the field of magnetic recording. This method is to take a partial response characteristic and code characteristic in combination with each other to increase the Euclidian distance between transmission-channel (recording/reading channel) output sequences (free squared Euclidian distance: $d^2_{free}$). An increase in $d^2_{free}$ is equivalent to an increase in signal level. Therefore, the TCPR method improves SNR (signal-to-noise ratio) of data when detected. The code used in the TCPR method is generally called "trellis code".

Note here that the extended partial response Class 4 (will be referred to as "EPR4" hereinafter) normally used as a partial response provides a method of equalizing waveforms equalized for unit-pulse response to each other to be (1, 1, −1, −1) at a sampling point (where a symbol exists). The system polynominal equation of EPR4 is expressed like a following formula (1):

$$G(D)=(1-D)(1+D)^2 \qquad (1)$$

where D is a 1-bit delay operator.

A state transition diagram of EPR4 is shown in FIG. 12, and a trellis diagram of EPR4 is shown in FIG. 13. The minimum Euclidian distance $d^2_{free}$ indicated with a doublet in the trellis diagram of EPR4 is:

$$d^2_{free}=((+1)-(0))^2+((+1)-(0))^2+((-1)-(0))^2+((-1)-(0))^2=4$$

In the trellis-coded extended partial response Class 4 (will be referred to as "TCEPR4" hereinafter) in which the maximum-likelihood decoding is done with the use of EPR4 and constraints of modulation code, the squared Euclidian distance $d^2_{free}$ can be increased from 4 to 6 by constraining the 16/18 code and thus a Viterbi detection gain of 1.8 dB can be gained for EPR4.

Since a Viterbi decoder for TCEPR4 operates at every predetermined 18 bits, even a phase lag of 1 bit will result in decoding a quite different bit.

Therefore, to reset the TCEPR4 Viterbi decoder at every predetermined 18 bits, a synchronization has to be detected. The synchronization detection itself has to be made by an EPR4 Viterbi decoder inferior by 1.8 dB in detection gain.

Note here that the accuracy of block sync signal detection will greatly influence the quality of data reception or reading. For example, if no sync signal can be detected due to any disturbance, all data will be lost. Also, if a sync signal is erroneously detected, all data will be lost for a period from the erroneous detection until a sync signal is correctly detected. Further, in the DAT, for example, if a sync word is erroneously detected, ID data will also be detected erroneously. ID data includes address information, and if it is written to a memory with the use of an erroneously detected address, data in other blocks will also possibly be destroyed.

DISCLOSURE OF THE INVENTION

Accordingly, the present invention has an object to overcome the above-mentioned drawbacks of the related art by enabling to distinguish a sync signal from a code sequence and recognize the head of a block formed from a plurality of code words at the time of data reception or reading.

The present invention has another object to enhance a sync word pattern detected by EPR4 by keeping an error in a sync work pattern at a distance from all 16/18 codes and reducing the probability of no detection by self-correction.

The above object can be attained by providing a data transmission method in which data is transmitted with a block sync signal added to the head of a block composed of a plurality of code words, wherein the block sync signal has more than one succession of 9 same bits when the maximum length of a succession of same bits in a code sequence is Tmax=8.

Also the above object can be attained by providing a data transmission method in which data is transmitted with a block sync signal added to the head of a block composed of a plurality of code words, wherein in a detection trellis having a time-varying structure and used for maximum likelihood detection of a code sequence including the block sync signal from an output sequence of a transmission channel, block sync signals different in start-point state from each other are unique, respectively, and identical in end-point state to each other.

Also the above object can be attained by providing a block sync signal detection method of detecting a block sync signal transmitted as an addition to the head of a block composed of a plurality of code words, wherein in a detection trellis having a time-varying structure and used for maximum likelihood detection of a code sequence including the block sync signal from an output sequence of a transmission channel, block sync signals different in start-point state from each other are unique, respectively, and identical in end-point state to each other, and the block sync signal detection is done with the use of a window signal having a detection window that is based on a detected sync signal.

Also the above object can be attained by providing a block sync signal detection method of detecting a block sync signal transmitted as an addition to the head of a block composed of a plurality of code words, wherein in a detection trellis having a time-varying structure and used for maximum likelihood detection of a code sequence including the block sync signal from an output sequence of a transmission channel, block sync signals different in start-point state from each other are unique, respectively, and identical in end-point state to each other, and a block sync signal is detected, the start-point state of a TCPR Viterbi detector in the detection trellis is detected with the block sync signal according to the uniqueness of the detected block sync signal and a branch metric is preset after detection of the block sync signal.

Also the above object can be attained by providing a player in which a code sequence including a transmitted sync signal is detected from an output sequence of a transmission channel having a predetermined characteristic, the player including according to the present invention a non-time-varying detection means for detecting a code sequence including a block sync signal from an output sequence of a transmission channel, a sync signal detection means for detecting a block sync signal from an output from the non-time-varying detection means and outputting the information, a Viterbi detection means initialized with a block sync signal information output from the sync signal detection means to make Viterbi detection of a code sequence including a block sync signal from the transmission-channel output sequence with the use of a detection trellis having a time-varying structure, and a window signal generation means for generating a window signal having a block sync signal detection window that is based on a block sync signal detected by the sync signal detection means and a detection output from the Viterbi detection means, the sync signal detection means detecting a block sync signal with the use of the window signal generated by the window signal generation means.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIGS. 8A and 8B show states of generating a 36-bit code by shifting a 16/18 code of 54 bits bit by bit and calculating a squared Euclidian distance between a sync word pattern and its erroneous pattern.

BEST MODE FOR CARRYING OUT THE INVENTION

An embodiment of the present invention will be described herebelow with reference to the accompanying drawings.

Figure 1:
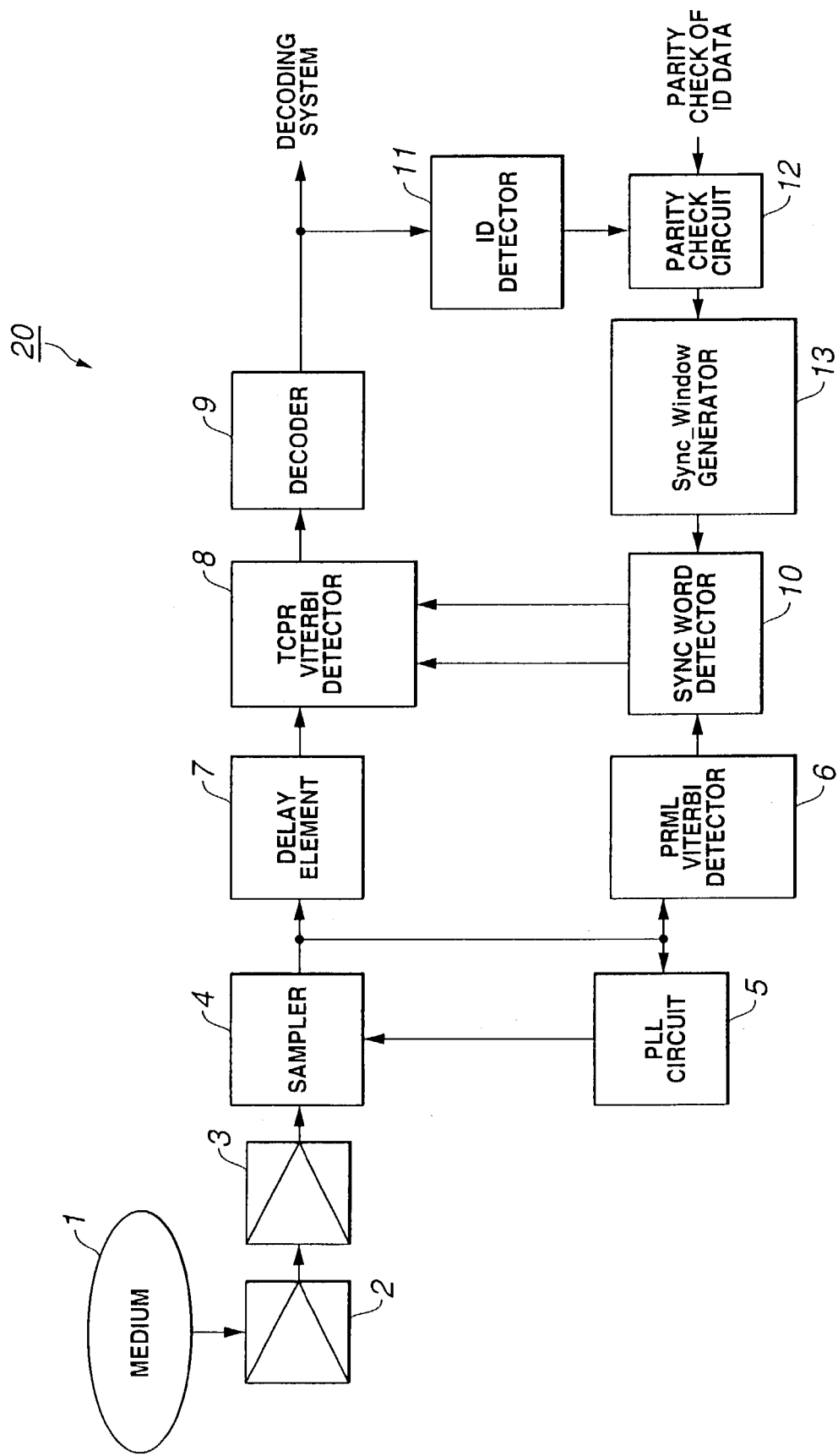
FIG. 1 is a block diagram of a player according to the present invention.

The present invention is applied to a player 20 constructed as shown in FIG. 1 for example. The player 20 adopts the TCEPR method that uses a time-varying trellis code.

The 16/18 conversion in TCEPR4 adopted in the player 20 according to the present invention is constrained at a connection between codes correspondingly to a state as shown in Table 1.

TABLE 1

| State | S | Z | P | ZP | PZ | ZH | PH | ZPH | PZH | ZT | PT | ZPT | PZT |
|---|---|---|---|---|---|---|---|---|---|---|---|---|---|
| S0 | 8 | 8 | 8 | 8 | 8 | 8 | 3 | 3 | 7 | 5 | 5 | 4 | 4 |
| S1 | 8 | 8 | 8 | 8 | 8 | 3 | 8 | 3 | 4 | 5 | 5 | 4 | 4 |
| S2 | 4 | 8 | 8 | 8 | 8 | 3 | 8 | 7 | 3 | 5 | 5 | 4 | 4 |
| S3 | 4 | 8 | 8 | 8 | 8 | 8 | 3 | 4 | 3 | 5 | 5 | 4 | 4 |

In Table 1, S: ADS start state, Z: Max. number of 0s in succession, P: Max. number of 1s in succession, ZP: Max. number of 01s in succession, PZ: Max. number of 10s in succession, ZH: Max. number of 0s in succession at the head of code word, PH: Max. number of 1s in succession at the head of code word, ZPH: Max. number of 01s in succession at the head of code word, PZH: Max. number of 10s in succession at the head of code word, ZT: Max. number of 0s in succession at the end of code word, PT: Max. number of 1s in succession at the end of code word, ZPT: Max. number of 01s in succession at the end of code word, PZT: Max. number of 10s in succession at the end of code word, and $1 \leq ADS \leq 11$.

Figure 2:
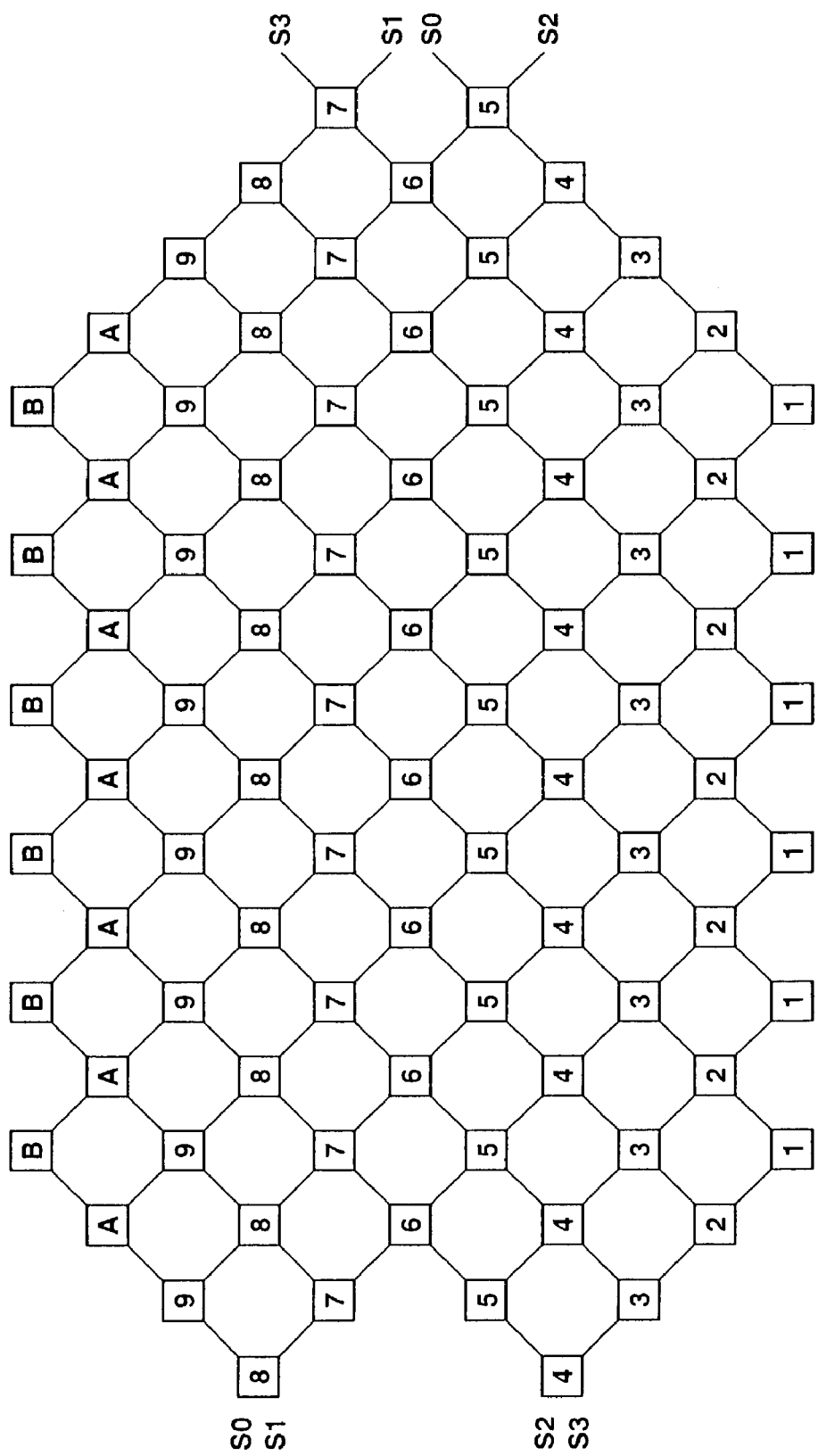
FIG. 2 shows the trellis constraints of TCPR.

Also, the trellis constraints of TCPR as shown in FIG. 2 are satisfied.

The player 20 includes an equalizer 3 supplied with read signal from a medium 1 via a read amplifier 2, a PLL circuit 5 and PRML Viterbi detector 6, each supplied with output from the equalizer 3 via a sampler 4, a TCPR Viterbi detector 8 supplied with output from the sampler 4 via a delay element 7, a decoder 9 supplied with output from the TCPR Viterbi detector 8, a sync word detector 10 supplied with output from the PRML a Viterbi detector 6, an ID detector 11 supplied with output from the decoder 9, a parity check circuit 12 supplied with output from the ID detector 11, a window signal generator 13 supplied with output from the parity check circuit 12, etc. In the player 20, output from the window signal generator 13 is supplied to the sync word detector 10 whose output is supplied to the TCPR Viterbi detector 8.

Figure 3:
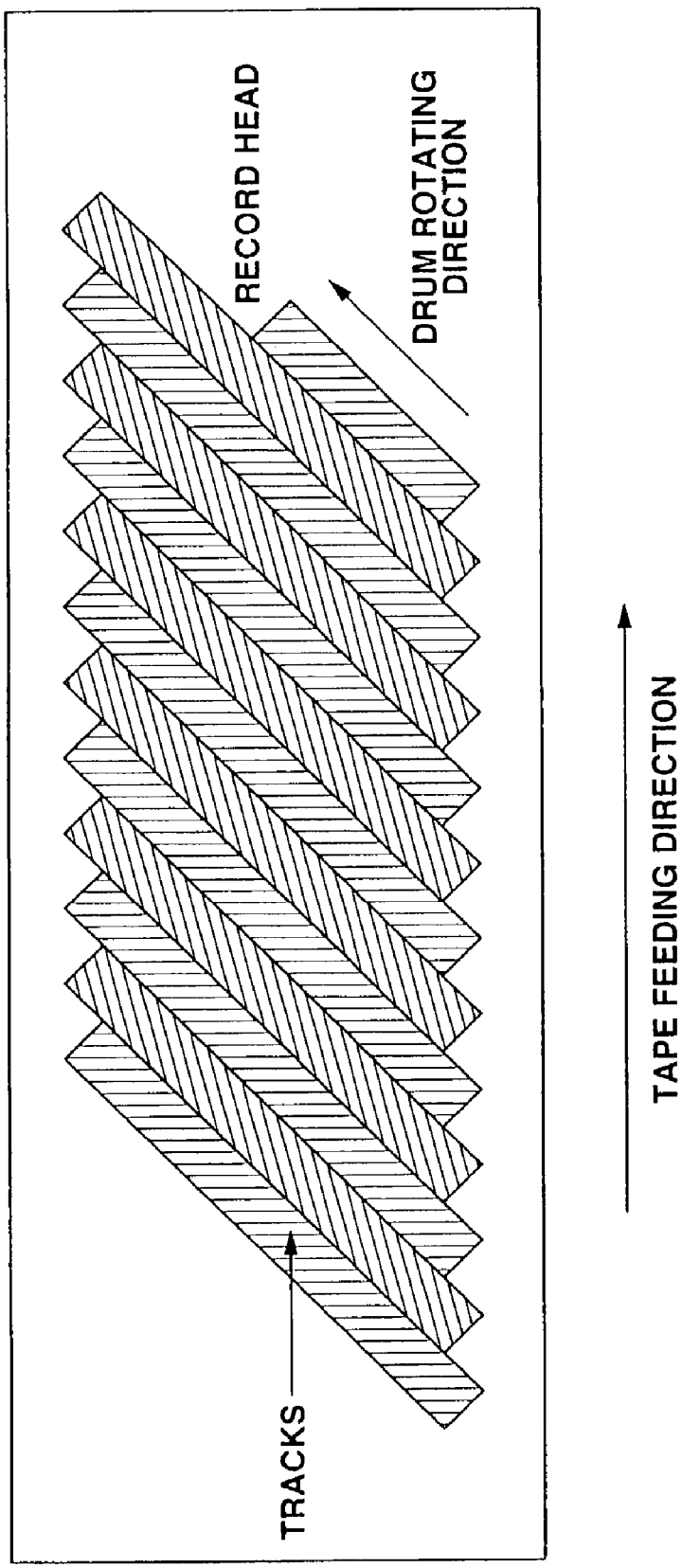
FIG. 3 shows tracks on a magnetic tape used as a recording medium in the player according to the present invention.
Figure 4:
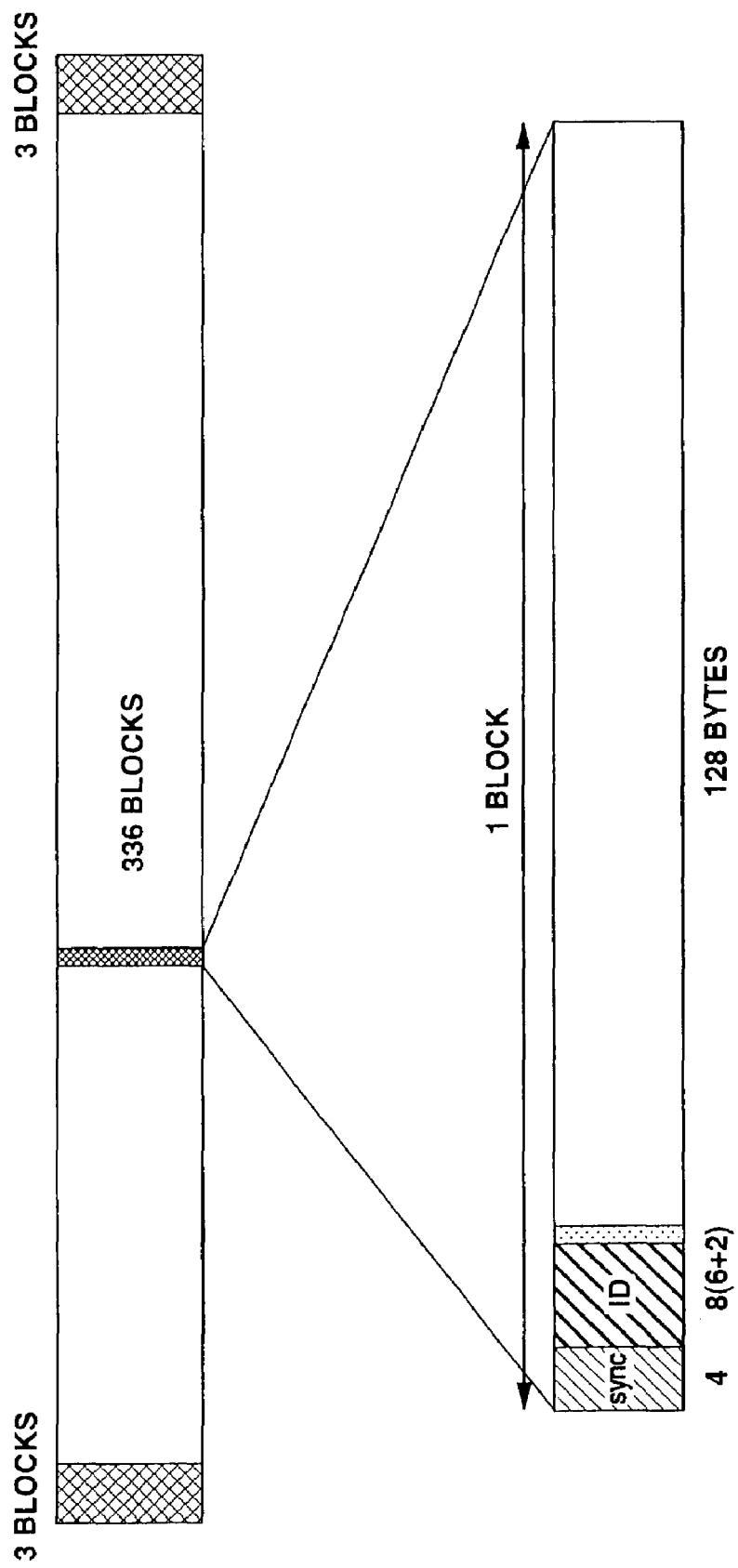
FIG. 4 shows a track format on the magnetic tape.

Note here that the medium 1 is a magnetic tape, for example, and has information recorded in a track format as shown in FIG. 4 on tracks inclined in relation to the tape feeding direction as in FIG. 3. One track has 336 data blocks between a preamble and postamble, each of 3 blocks. One block consists of a 4-byte sync word, 8-byte ID information and 128-byte data.

In the player 20, signal read from the medium 1 and amplified by the read amplifier 2 is equalized by the equalizer 3 to a predetermined partial response characteristic, and then sampled by the sampler 4. The signal sampled by the sampler 4 is supplied to the PLL circuit 5, to the sync word detector 10 via the PRML Viterbi detector 6, and also to the TCPR Viterbi detector 8 via the delay element 7.

The PLL circuit 5 extracts a clock from the signal sampled by the sampler 4. The sampler 4 and PRML Viterbi detector 6, TCPR Viterbi detector 8, decoder 9, sync word detector 10, etc. operate according to a clock given by the PLL circuit 5.

The PRML Viterbi detector 6 detects data with the use of a detection trellis not including the characteristic of a time-varying trellis code. The PRML Viterbi detector 6 has not to know any boundary of a code word and thus can detect data asynchronously.

The sync word detector 10 uses a window signal Sync_window supplied from the window signal generator 13 to detect a sync word as to a bit string detected by the PRML Viterbi detector 6. The sync word detector 10 supplies a sync-word detection signal to the TCPR Viterbi detector 8 while supplying the TCPR Viterbi detector 8 with a state specifying signal indicating which state of the TCPR Viterbi detector 8 should have the likelihood thereof increased.

The TCPR Viterbi detector 8 detects data with the use of a detection trellis including the characteristic of the time-varying code. It will not correctly operate unless it knows the boundary of a code word. Thus, the TCPR Viterbi detector 8 starts detecting one block of data after it has the likelihood thereof initialized with a state specifying signal supplied from the sync word detector 10 and synchronized by the sync-word detection signal.

The data detected by the TCPR Viterbi detector 8 is supplied to the decoder 9 which will decode it to a code word.

Note that the delay element 7 is provided to delay signal supplied from the sampler 4 to the TCPR Viterbi detector 8 a time equivalent to a delay of the sync-word detection signal that has been caused by an internal delay of the PRML Viterbi detector 6 and sync word detector 10.

The ID detector 11 detects ID information included in output from the decoder 9, and supplies it to the parity check circuit 12.

The parity check circuit 12 checks the parity of the ID information detected by the ID detector 11, and supplies a parity OK signal to the window signal generator 13 when the parity of the ID information is normal.

Figure 5:
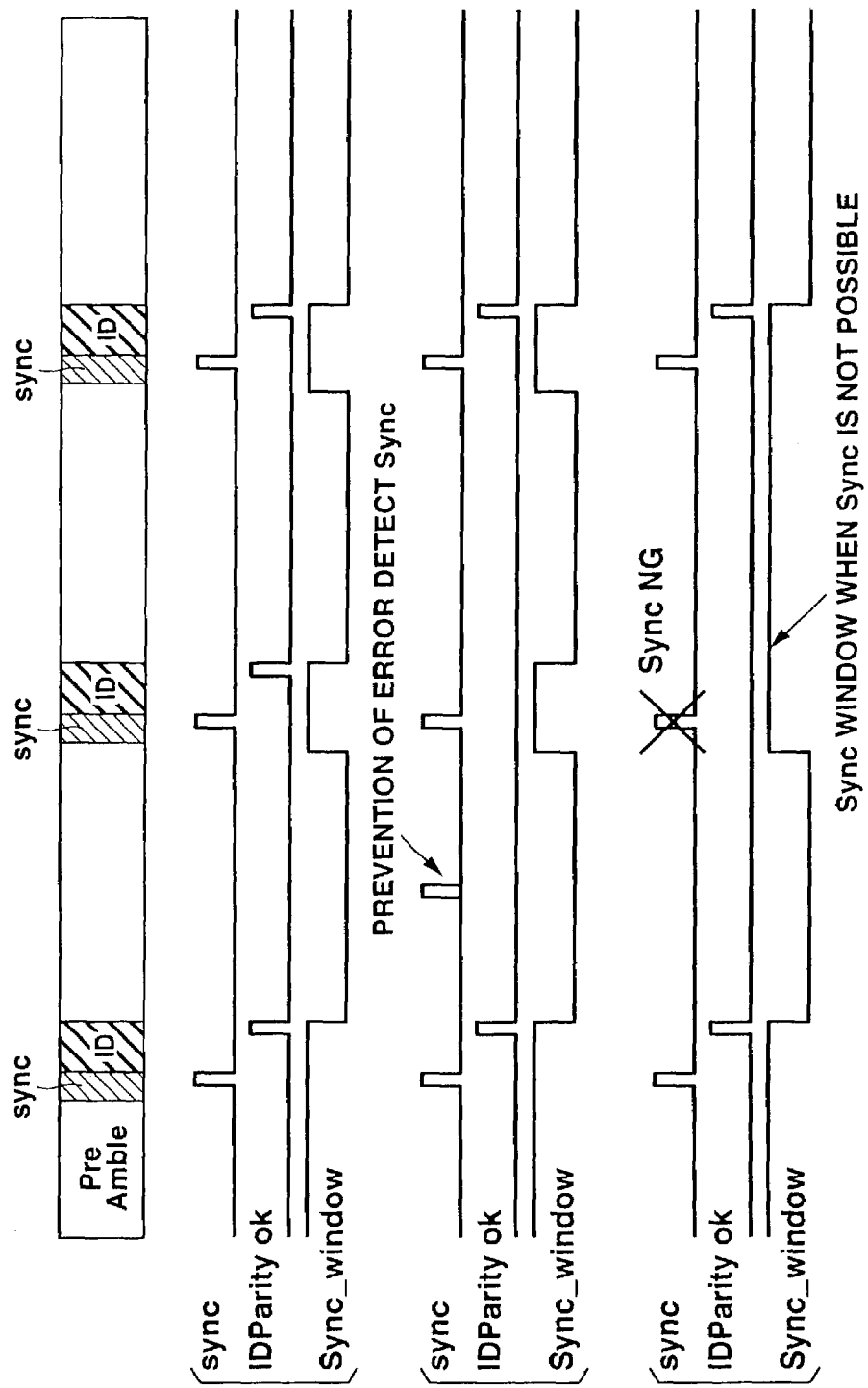
FIGS. 5A to 5C show timing charts showing operations of the window signal generator and sync word detector in the player according to the present invention.

Based on the parity OK signal supplied from the party check circuit 12, the window signal generator 13 generates a window signal Sync_window indicating a period of interval between the sync word and the ID information, included in the read signal from the medium 1, as shown in FIG. 5A, and supplies the window signal Sync_window to the sync word detector 10.

Supplied with the window signal Sync_window indicating the period of interval between the sync word and ID information, included in the read signal from the medium 1, the sync word detector 10 detects a sync word as to a bit string detected by a PRML Viterbi detector 6 with the use of the window signal Sync_window generated based on the parity OK signal supplied from the parity check circuit 12. Thus, it will not erroneously detect any sync word during any period other than a detection window indicated by the window signal Sync_window, as shown in FIG. 5B, and can also detect synchronization in a next timing as shown in FIG. 5C when it cannot detect any sync word.

Figure 6:
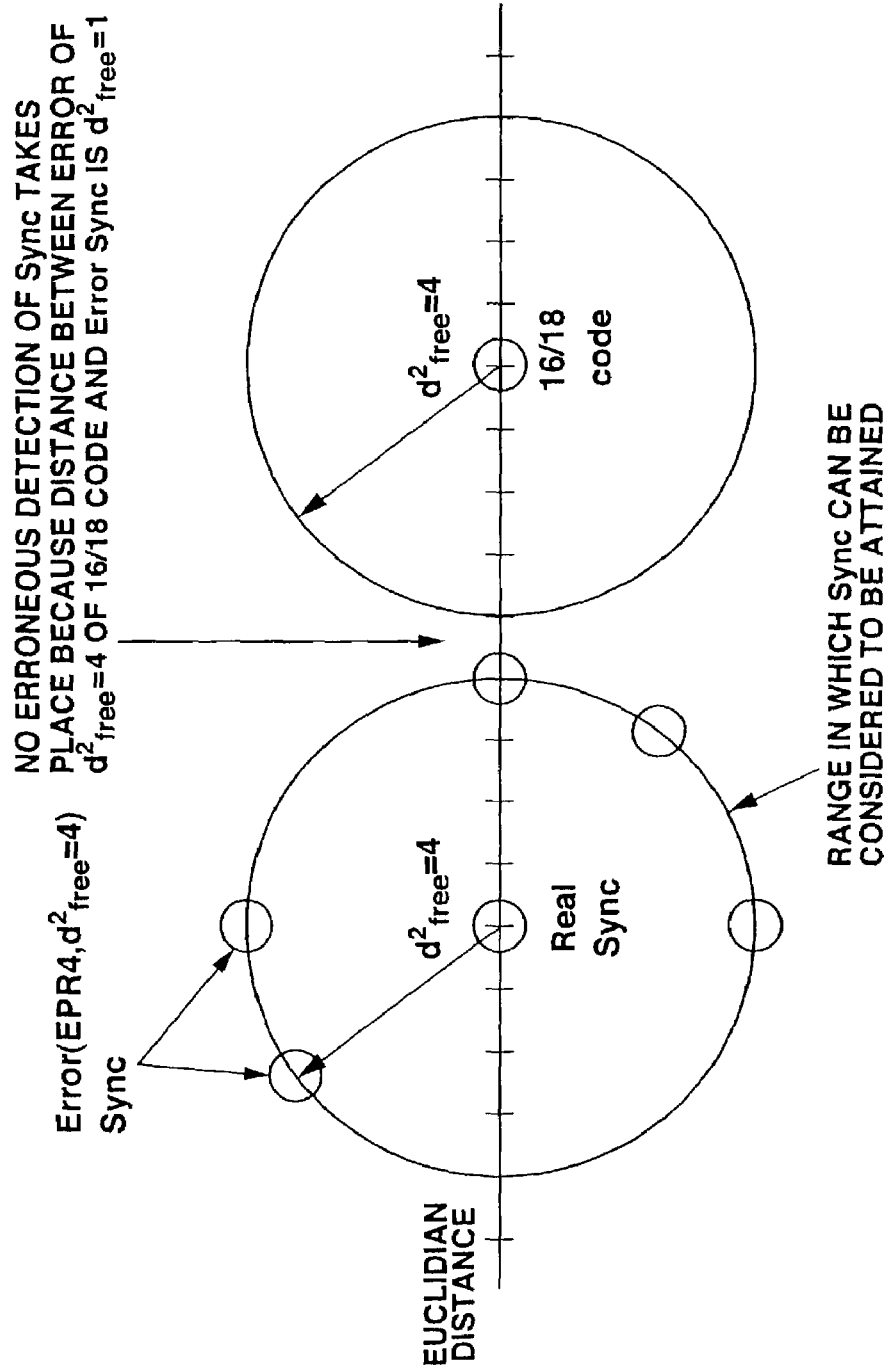
FIG. 6 shows how a sync word is detected in the sync word detector.

As shown in FIG. 6, the sync word detector 10 detects a sync word with a higher probability by regarding, as a sync word, a pattern having an error in which the squared Euclidian distance between sync words is less than 4 to allow an error, if any, having taken place in the sync word. At this time, no erroneous detection of a sync word will be caused by separating the sync word a distance of more than 1 from an error in which the squared Euclidian distance from a code word is 4.

A sync word pattern is selected to meet following conditions 1 to 3.

Condition 1:

A sync word should meet the trellis constraints of TCEPR4. The connection between the preamble and postamble of a sync word is not under any connection constraint of the 16/18 conversion. However, it should be noted that the connection between the sync word and code word meets the connection constraint of the 16/18 conversion.

Condition 2:

A sync word should include at least one Z=9 and one P=9, namely, a total of three in order to keep a distance from a code word.

Condition 3:

To prevent resetting in any wrong position, sync word patterns in four initial states, including their erroneous patterns, should be set not to be similar to each other when they are shifted.

To meet the above conditions 1 to 3, sync word patterns (sync pattern) shown in Table 2 were determined as will be described below.

TABLE 2

| Initial state | Sync pattern | Erroneous pattern | End state |
|---|---|---|---|
| S0 | 001111111100001100000000011111111110 | 109 | S1 |
| S1 | 110011111111001100000000011111111110 | 107 | S1 |
| S2 | 110111111111000110000000011111111110 | 114 | S1 |
| S3 | 000111111111000110000000011111111110 | 109 | S1 |

Figure 7:
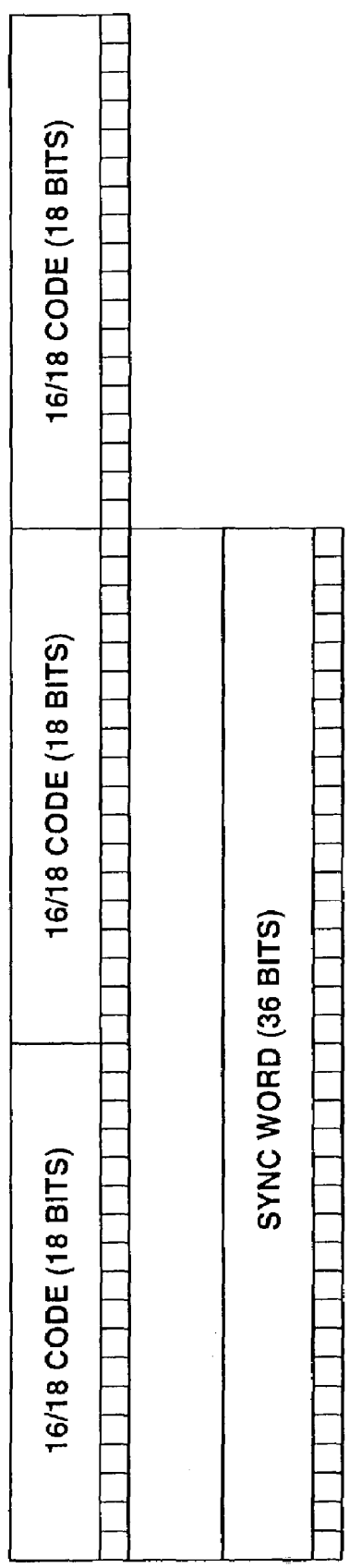
FIG. 7 shows a 54-bit code resulted from the 16/18 conversion of 48-bit data in four trellis-constrained initial states of TCEPR4 and a 36-bit sync word pattern for calculation of a squared Euclidian distance in EPR4.

First, a 16/18-converted 54-bit code having four trellis-constraint initial states of TCEPR4 is generated from 48-bit data, squared Euclidian distances in EPR4 between a sync word pattern in four trellis-constraint initial states and all 36-bit signals and are calculated, and sync word patterns whose square Euclidian distance is less than 4 are taken as erroneous patterns, as shown in FIG. 7.

Next, squared Euclidian distances between the sync word pattern and its erroneous patterns and all 36-bit 16/18 codes were calculated and the distances were confirmed to be more than 5.

Then, to keep a distance from the patterns when the 16/18 code is shifted, the 54-bit 16/18 code was shifted bit by bit to generate a 36-bit code and a square Euclidian distance between the sync word pattern and its erroneous pattern was calculated, as shown in FIGS. 8A and 8B.

Figure 9:
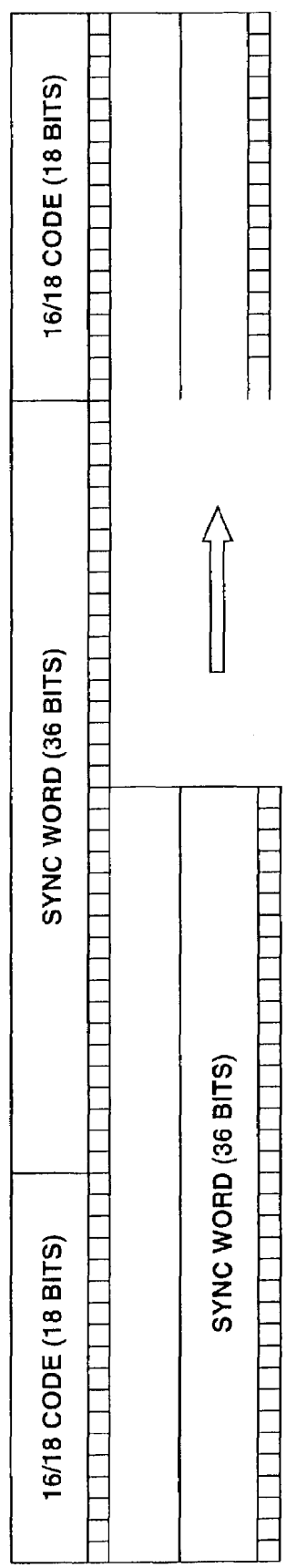
FIG. 9 shows show states of calculating a squared Euclidian distance in EPR4 between a sync word pattern and its erroneous pattern by shifting, bit by bit, a 36-bit sync word pattern, its erroneous pattern and a 72-bit signal obtained with 18 bits added to before and after the 36-bit sync word.

Also, if there exists any pattern similar to a sync word due to the combination of a code word and sync word, the sync word will possibly be detected in a wrong position. To prevent any resetting from being caused in any wrong position by a signal including a succession of sync words and code words, a 72-bit signal consisting of a 36-bit sync word pattern and its erroneous pattern, having 18 bits added to either end thereof was generated, the 72-bit signal was shifted bit by bit as shown in FIG. 9, a squared Euclidian distance in EPR4 between the sync word pattern and its erroneous pattern was calculated and the distance was confirmed to be more than 5.

Figure 10:
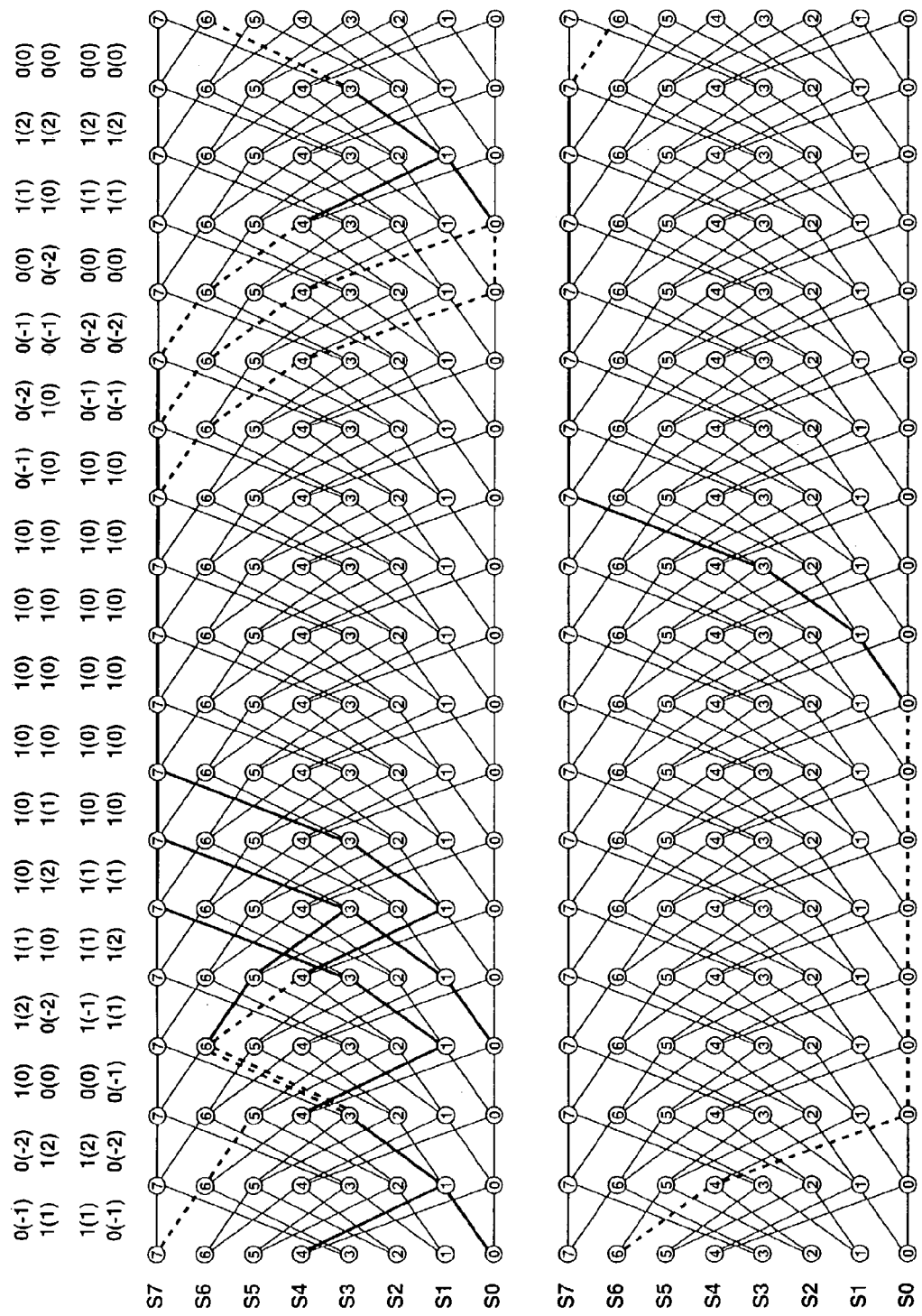
FIG. 10 shows a sync word pattern and a trellis diagram of EPR4.

FIG. 10 shows a sync word pattern and a trellis diagram of EPR4.

Also, squared Euclidian distances of erroneous patterns of a sync word pattern, corresponding to four initial states shown in Table 2, are as follows.

That is, squared Euclidian distances per bit of erroneous patterns of a sync word pattern in an initial state S0 are as shown in Tables 3 to 5.

TABLE 3

| Sync word pattern in state 0 (001111111110000110000000001111111110) | |
|---|---|
| Erroneous pattern | Squared Euclidian distance per bit |
| 001111111110000100000000001111111110 | 000000000000000001110000000000000000 |
| 001111111110000010000000001111111110 | 000000000000000011110000000000000000 |
| 000101010100000110000000001111111110 | 001100000000110000000000000000000000 |
| 001101010100000110000000001111111110 | 000011000000110000000000000000000000 |
| 001111010100000110000000001111111110 | 000000110000110000000000000000000000 |
| 001111110100000110000000001111111110 | 000000001100110000000000000000000000 |
| 001111111100000110000000001111111110 | 000000000011110000000000000000000000 |
| 001010101010000110000000001111111110 | 001100000011000000000000000000000000 |
| 001110101010000110000000001111111110 | 000001100011000000000000000000000000 |
| 001111101010000110000000001111111110 | 000000011001100000000000000000000000 |
| 001111111010000110000000001111111110 | 000000000111000000000000000000000000 |
| 000101010110000110000000001111111110 | 001100000011000000000000000000000000 |
| 001101010110000110000000001111111110 | 000011000110000000000000000000000000 |
| 001111010110000110000000001111111110 | 000000011001100000000000000000000000 |
| 001111110110000110000000001111111110 | 000000000111000000000000000000000000 |
| 001010101110000110000000001111111110 | 001100001100000000000000000000000000 |
| 001110101110000110000000001111111110 | 000001100110000000000000000000000000 |
| 001111101110000110000000001111111110 | 000000001111000000000000000000000000 |
| 000101011110000110000000001111111110 | 001100001100000000000000000000000000 |
| 001101011110000110000000001111111110 | 000011001100000000000000000000000000 |
| 001111011110000110000000001111111110 | 000000001111000000000000000000000000 |
| 001010111110000110000000001111111110 | 001100110000000000000000000000000000 |
| 001110111110000110000000001111111110 | 000001111000000000000000000000000000 |
| 000101111110000110000000001111111110 | 001100110000000000000000000000000000 |
| 001101111110000110000000001111111110 | 000011110000000000000000000000000000 |
| 000101111110000110000000001111111110 | 000111100000000000000000000000000000 |
| 000111111110000110000000001111111110 | 001111000000000000000000000000000000 |
| 001111111110000110000000001010101000 | 000000000000000000000000000110000010 |
| 001111111110000110000000001110101000 | 000000000000000000000000000001100010 |
| 001111111110000110000000001111101000 | 000000000000000000000000000000011010 |
| 001111111110000110000000001010100100 | 000000000000000000000000000110001010 |
| 001111111110000110000000001110100100 | 000000000000000000000000000001101010 |
| 001111111110000110000000001010010100 | 000000000000000000000000000110101000 |
| 001111111110000110000000000101010100 | 000000000000000000000000001100000000 |
| 001111111110000110000000001101010100 | 000000000000000000000000000011000000 |
| 001111111110000110000000001011010100 | 000000000000000000000000000111010000 |
| 001111111110000110000000001111010100 | 000000000000000000000000000000110000 |
| 001111111110000110000000001010110100 | 000000000000000000000000000110010100 |

TABLE 4

| Sync word pattern in state 0 (001111111110000110000000001111111110) | |
|---|---|
| Erroneous pattern | Squared Euclidian distance per bit |
| 001111111110000110000000001110110100 | 000000000000000000000000000001110100 |
| 001111111110000110000000001111110100 | 000000000000000000000000000000001100 |
| 001111111110000110000000001010101100 | 000000000000000000000000000110000101 |
| 001111111110000110000000001110101100 | 000000000000000000000000000001100101 |
| 001111111110000110000000001111101100 | 000000000000000000000000000000011101 |
| 001111111110000110000000001111111100 | 000000000000000000000000000000000011 |
| 001111111110000110000000001010101010 | 000000000000000000000000000110000001 |

TABLE 4-continued

Sync word pattern in state 0 (0011111111100001100000000001111111110)

| Erroneous pattern | Squared Euclidian distance per bit |
|---|---|
| 0011111111100001100000000001110101010 | 000000000000000000000000000001100001 |
| 0011111111100001100000000001111101010 | 0000000000000000000000000000000011001 |
| 0011111111100001100000000001111111010 | 0000000000000000000000000000000000111 |
| 0011111111100001100000000000101010110 | 000000000000000000000000000001100000011 |
| 0011111111100001100000000001101010110 | 00000000000000000000000000000011000011 |
| 0011111111100001100000000001111010110 | 000000000000000000000000000000000110011 |
| 0011111111100001100000000001111110110 | 00000000000000000000000000000000001111 |
| 0011111111100001100000000001010101110 | 0000000000000000000000000000000110000110 |
| 0011111111100001100000000001110101110 | 0000000000000000000000000000000001100110 |
| 0011111111100001100000000001111101110 | 0000000000000000000000000000000000011110 |
| 0011111111100001100000000000101011110 | 00000000000000000000000000000001100001100 |
| 0011111111100001100000000001101011110 | 00000000000000000000000000000000011001100 |
| 0011111111100001100000000001111011110 | 000000000000000000000000000000000111100 |
| 0011111111100001100000000001010111110 | 00000000000000000000000000000000110011000 |
| 0011111111100001100000000001110111110 | 00000000000000000000000000000000001111000 |
| 0011111111100001100000000001011011110 | 000000000000000000000000000000001100110 |
| 0011111111100001100000000001101111110 | 00000000000000000000000000000000011110000 |
| 0011111111100001100000000001011111110 | 00000000000000000000000000000000111100000 |
| 0011111111100001100000000001111111110 | 0000000000000000000000000000001111000000 |
| 0011111111100001101000000001111111110 | 000000000000000000000001111000000000000 |
| 0011111111100001100100000001111111110 | 0000000000000000000000011110000000000000 |
| 0011111111100001100010000001111111110 | 000000000000000000000001111000000000000 |
| 0011111111100001101010000001111111110 | 0000000000000000000000011001100000000000 |
| 0011111111100001100001000001111111110 | 00000000000000000000000111100000000000 |
| 0011111111100001100101000001111111110 | 000000000000000000000001100110000000000 |
| 0011111111100001100000100001111111110 | 000000000000000000000000111100000000000 |
| 0011111111100001100010100001111111110 | 000000000000000000000001100110000000000 |
| 0011111111100001101010100001111111110 | 00000000000000000000001100011000000000 |
| 0011111111100001100000100101111111110 | 000000000000000000000000111100000000000 |
| 0011111111100001100001010011111111110 | 000000000000000000000001100110000000000 |
| 0011111111100001100101010011111111110 | 000000000000000000000011000011000000000 |
| 0011111111100001100000000101111111110 | 0000000000000000000000000111100000000 |
| 0011111111100001100000101011111111110 | 0000000000000000000000011001100000000 |

TABLE 5

Sync word pattern in state 0 (0011111111100001100000000001111111110)

| Erroneous pattern | Squared Euclidian distance per bit |
|---|---|
| 0011111111100001100010101011111111110 | 00000000000000000000011000011000000000 |
| 0011111111100001101010101011111111110 | 0000000000000000000011000001100000000 |
| 0011111111100001100000000011111111110 | 00000000000000000000000000111100000000 |
| 0011111111100001100000001011111111110 | 000000000000000000000001100110000000 |
| 0011111111100001100001010111111111110 | 00000000000000000000000110000110000000 |
| 0011111111100001100101010111111111110 | 000000000000000000001100000110000000 |
| 0011111111100001100000000001010101001 | 0000000000000000000000000000000110000011 |
| 0011111111100001100000000001110101001 | 00000000000000000000000000000000011000011 |
| 0011111111100001100000000001111101001 | 0000000000000000000000000000000000011011 |
| 0011111111100001100000000000101010101 | 000000000000000000000000000000011000000001 |
| 0011111111100001100000000001101010101 | 0000000000000000000000000000000000011000001 |
| 0011111111100001100000000001111010101 | 0000000000000000000000000000000000000110001 |
| 0011111111100001100000000001111110101 | 0000000000000000000000000000000000000001101 |
| 0011111111100001100000000001010101101 | 00000000000000000000000000000000011000001100 |
| 0011111111100001100000000001110101101 | 000000000000000000000000000000000000001100100 |
| 0011111111100001100000000001111101101 | 0000000000000000000000000000000000000011100 |
| 0011111111100001100000000001111111101 | 0000000000000000000000000000000000000000010 |
| 0011111111100001100000000001111111111 | 00000000000000000000000000000000000000001 |
| 1011111111100001100000000001111111110 | 1111000000000000000000000000000000000 |
| 0111111111100001100000000001111111110 | 01111000000000000000000000000000000000 |
| 0011111111100001000000000001111111110 | 00000000000011100000000000000000000000 |
| 0011111111101001100000000001111111110 | 000000000001110000000000000000000000 |
| 0011111111100101100000000001111111110 | 000000000000011110000000000000000000 |
| 0011111111101011100000000001111111110 | 00000000000110011000000000000000000 |
| 0011111111100011100000000001111111110 | 0000000000001111000000000000000000000 |
| 0011111111101011000000000001111111110 | 00000000000110011000000000000000000 |
| 0011111111100011000000000001111111110 | 0000000000000111100000000000000000000 |
| 0011111111100001101000000001111111110 | 000000000000001100110000000000000000 |
| 0011111111100001101010000001111111110 | 000000000000001100001100000000000000 |
| 0011111111100001101010100001111111110 | 00000000000000011000001100000000000 |
| 0011111111100001101010101011111111110 | 00000000000000011000000001100000000 |

Also, squared Euclidian distances per bit of erroneous patterns of a sync word pattern in an initial state S1 are as shown in Tables 6 to 8.

TABLE 6

Sync word pattern in state 1 (1100111111111100110000000001111111110)

| Erroneous pattern | Squared Euclidian distance per bit |
|---|---|
| 1100111111111100100000000001111111110 | 0000000000000000111100000000000000000 |
| 1100111111111100010000000001111111110 | 0000000000000001111000000000000000000 |
| 1100010101010001100000000001111111110 | 0000110000000110000000000000000000000 |
| 1100110101010001100000000001111111110 | 0000001100000011000000000000000000000 |
| 1100111010101000100000000001111111110 | 0000000011000011000000000000000000000 |
| 1100111110101000100000000001111111110 | 0000000000110011000000000000000000000 |
| 1100111111101000100000000001111111110 | 0000000000001111000000000000000000000 |
| 1100010101010011000000000001111111110 | 0000110000001100000000000000000000000 |
| 1100111010101001100000000001111111110 | 0000000110001100000000000000000000000 |
| 1100111110101001100000000001111111110 | 0000000001100110000000000000000000000 |
| 1100111111101001100000000001111111110 | 0000000000111100000000000000000000000 |
| 1100010101011001100000000001111111110 | 0000110000011000000000000000000000000 |
| 1100110101011001100000000001111111110 | 0000001100011000000000000000000000000 |
| 1100111010110011000000000001111111110 | 0000000110011000000000000000000000000 |
| 1100111110110011000000000001111111110 | 0000000001111000000000000000000000000 |
| 1100101010111001100000000001111111110 | 0000110000110000000000000000000000000 |
| 1100111010111001100000000001111111110 | 0000000110011000000000000000000000000 |
| 1100111110111001100000000001111111110 | 0000000001111000000000000000000000000 |
| 1100010101111001100000000001111111110 | 0000110001100000000000000000000000000 |
| 1100110101111001100000000001111111110 | 0000001100110000000000000000000000000 |
| 1100111011111001100000000001111111110 | 0000000011110000000000000000000000000 |
| 1100101011111001100000000001111111110 | 0000110011000000000000000000000000000 |
| 1100110111111001100000000001111111110 | 0000001111000000000000000000000000000 |
| 1100010111111001100000000001111111110 | 0001100110000000000000000000000000000 |
| 1100110111111001100000000001111111110 | 0000011110000000000000000000000000000 |
| 1100101111111001100000000001111111110 | 0000111100000000000000000000000000000 |
| 1100011111111001100000000001111111110 | 0001111000000000000000000000000000000 |
| 1000111111111001100000000001111111110 | 0111100000000000000000000000000000000 |
| 0100111111111001100000000001111111110 | 1111000000000000000000000000000000000 |
| 1100111111111001100000000001010101000 | 0000000000000000000000000000110000010 |
| 1100111111111001100000000001110101000 | 0000000000000000000000000000001100010 |
| 1100111111111001100000000001111101000 | 0000000000000000000000000000000011010 |
| 1100111111111001100000000010101001000 | 0000000000000000000000000000110001010 |
| 1100111111111001100000000001110100100 | 0000000000000000000000000000001101010 |
| 1100111111111001100000000001010010100 | 0000000000000000000000000000110101010 |
| 1100111111111001100000000000101010100 | 0000000000000000000000000001100000000 |
| 1100111111111001100000000001101010100 | 0000000000000000000000000000011000000 |
| 1100111111111001100000000001011010100 | 0000000000000000000000000000111010000 |

TABLE 7

Sync word pattern in state 1 (1100111111111100110000000001111111110)

| Erroneous pattern | Squared Euclidian distance per bit |
|---|---|
| 1100111111111001100000000001111010100 | 0000000000000000000000000000000110000 |
| 1100111111111001100000000001010110100 | 0000000000000000000000000000110010100 |
| 1100111111111001100000000001110110100 | 0000000000000000000000000000001110100 |
| 1100111111111001100000000001111110100 | 0000000000000000000000000000000001100 |
| 1100111111111001100000000010101011100 | 0000000000000000000000000000110000101 |
| 1100111111111001100000000001110101100 | 0000000000000000000000000000001100101 |
| 1100111111111001100000000001111101100 | 0000000000000000000000000000000011101 |
| 1100111111111001100000000001111111100 | 0000000000000000000000000000000000011 |
| 1100111111111001100000000010101011010 | 0000000000000000000000000000110000001 |
| 1100111111111001100000000001110101010 | 0000000000000000000000000000001100001 |
| 1100111111111001100000000001111101010 | 0000000000000000000000000000000011001 |
| 1100111111111001100000000001111111010 | 0000000000000000000000000000000000111 |
| 1100111111111001100000000000101010110 | 0000000000000000000000000001100000011 |
| 1100111111111001100000000001101010110 | 0000000000000000000000000000011000011 |
| 1100111111111001100000000001111010110 | 0000000000000000000000000000000110011 |
| 1100111111111001100000000001111110110 | 0000000000000000000000000000000001111 |
| 1100111111111001100000000010101011110 | 0000000000000000000000000000110000110 |
| 1100111111111001100000000001110101110 | 0000000000000000000000000000001100110 |
| 1100111111111001100000000001111101110 | 0000000000000000000000000000000011110 |
| 1100111111111001100000000001010111110 | 0000000000000000000000000001100001100 |
| 1100111111111001100000000001101011110 | 0000000000000000000000000000011001100 |
| 1100111111111001100000000001111011110 | 0000000000000000000000000000000111100 |
| 1100111111111001100000000010101111110 | 0000000000000000000000000000110011000 |

TABLE 7-continued

Sync word pattern in state 1 (11001111111100110000000001111111110)

| Erroneous pattern | Squared Euclidian distance per bit |
|---|---|
| 11001111111100110000000001110111110 | 00000000000000000000000000001111000 |
| 11001111111100110000000000101111110 | 00000000000000000000000001100110000 |
| 11001111111100110000000001101111110 | 00000000000000000000000000011110000 |
| 11001111111100110000000001011111110 | 00000000000000000000000000111100000 |
| 11001111111100110000000000111111110 | 00000000000000000000000001111000000 |
| 11001111111100110100000001111111110 | 00000000000000000111100000000000000 |
| 11001111111100110010000001111111110 | 00000000000000000111100000000000000 |
| 11001111111100111000100001111111110 | 00000000000000000001111000000000000 |
| 11001111111100110101000001111111110 | 00000000000000000011001100000000000 |
| 11001111111100110000100001111111110 | 00000000000000000000111100000000000 |
| 11001111111100110010100001111111110 | 00000000000000000011001100000000000 |
| 11001111111100110000010001111111110 | 00000000000000000000011110000000000 |
| 11001111111100110001010001111111110 | 00000000000000000001100110000000000 |
| 11001111111100110101010001111111110 | 00000000000000000110000110000000000 |
| 11001111111100110000001001111111110 | 00000000000000000000001111000000000 |
| 11001111111100110000101001111111110 | 00000000000000000001100110000000000 |
| 11001111111100110010101001111111110 | 00000000000000000110000110000000000 |

TABLE 8

Sync word pattern in state 1 (11001111111100110000000001111111110)

| Erroneous pattern | Squared Euclidian distance per bit |
|---|---|
| 110011111111001100000001011111111110 | 000000000000000000000000111100000000 |
| 110011111111001100000101011111111110 | 000000000000000000000011001100000000 |
| 110011111111001100010101011111111110 | 000000000000000000001100001100000000 |
| 110011111111001101010101011111111110 | 000000000000000000110000011000000000 |
| 110011111111001100000000011111111110 | 000000000000000000000000011110000000 |
| 110011111111001100000001011111111110 | 000000000000000000000001100110000000 |
| 110011111111001100001010111111111110 | 000000000000000000001100001100000000 |
| 110011111111001101010101111111111110 | 000000000000000000110000011000000000 |
| 110011111111001100000000010101011001 | 000000000000000000000000000110000011 |
| 110011111111001100000000011101011001 | 000000000000000000000000000001100011 |
| 110011111111001100000000011111011001 | 000000000000000000000000000000011011 |
| 110011111111001100000000001010101011 | 000000000000000000000000000001100000011 |
| 110011111111001100000000011010101011 | 000000000000000000000000000000011000001 |
| 110011111111001100000000011110101011 | 000000000000000000000000000000001100001 |
| 110011111111001100000000011111101011 | 000000000000000000000000000000000001101 |
| 110011111111001100000000010101011011 | 000000000000000000000000000000110000100 |
| 110011111111001100000000011101011011 | 000000000000000000000000000000001100100 |
| 110011111111001100000000011111011011 | 000000000000000000000000000000000011100 |
| 110011111111001100000000011111111011 | 000000000000000000000000000000000000010 |
| 110011111111001100000000001111111111 | 000000000000000000000000000000000000001 |
| 11101111111100110000000001111111110 | 00111100000000000000000000000000000 |
| 10111111111100110000000001111111110 | 00011110000000000000000000000000000 |
| 11000111111101100000000001111111110 | 00000000000111100000000000000000000 |
| 11001111110110000000000001111111110 | 00000000000011110000000000000000000 |
| 11001111111100110000000001111111110 | 00000000000000001111000000000000000 |
| 11001111111100111010000001111111110 | 00000000000000001100110000000000000 |
| 11001111111100110101000001111111110 | 00000000000000011000011000000000000 |
| 11001111111100110101010011111111110 | 00000000000000110000011000000000000 |
| 11001111111100110101010111111111110 | 00000000000000110000000110000000000 |

Also, squared Euclidian distances per bit of erroneous patterns of a sync word pattern in an initial state S2 are as shown in Tables 9 to 11.

TABLE 9

Sync word pattern in state 2 (11011111111100110000000001111111110)

| Erroneous pattern | Squared Euclidian distance per bit |
|---|---|
| 11011111111000100000000001111111110 | 00000000000000001111000000000000000 |
| 11011111111000010000000001111111110 | 00000000000000111100000000000000000 |
| 10001010101000011000000001111111110 | 01100000000001100000000000000000000 |
| 11001010101000011000000001111111110 | 00011000000001100000000000000000000 |
| 11011010101000011000000001111111110 | 00000110000001100000000000000000000 |

TABLE 9-continued

Sync word pattern in state 2 (11011111111100011000000001111111110)

| Erroneous pattern | Squared Euclidian distance per bit |
|---|---|
| 11011110101000011000000001111111110 | 00000001100011000000000000000000000 |
| 11011111101000011000000001111111110 | 00000000011001100000000000000000000 |
| 11011111111000011000000001111111110 | 00000000000111000000000000000000000 |
| 11010101010100011000000001111111110 | 00001100000011000000000000000000000 |
| 11011101010100011000000001111111110 | 00000011000011000000000000000000000 |
| 11011111010100011000000001111111110 | 00000000110011000000000000000000000 |
| 11011111110100011000000001111111110 | 00000000001111000000000000000000000 |
| 10001010101100011000000001111111110 | 01100000000110000000000000000000000 |
| 11001010101100011000000001111111110 | 00011000001100000000000000000000000 |
| 11011010101100011000000001111111110 | 00000110000110000000000000000000000 |
| 11011110101100011000000001111111110 | 00000001100110000000000000000000000 |
| 11011111101100011000000001111111110 | 00000000011110000000000000000000000 |
| 11010101011100011000000001111111110 | 00001100001100000000000000000000000 |
| 11011101011100011000000001111111110 | 00000011001100000000000000000000000 |
| 11011111011100011000000001111111110 | 00000000111100000000000000000000000 |
| 10001010111100011000000001111111110 | 01100000001100000000000000000000000 |
| 11001010111100011000000001111111110 | 00011000011000000000000000000000000 |
| 11011010111100011000000001111111110 | 00000110011000000000000000000000000 |
| 11011110111100011000000001111111110 | 00000001111000000000000000000000000 |
| 11010101111100011000000001111111110 | 00001100011000000000000000000000000 |
| 11011101111100011000000001111111110 | 00000011110000000000000000000000000 |
| 10001011111100011000000001111111110 | 01100001100000000000000000000000000 |
| 11001011111100011000000001111111110 | 00011001100000000000000000000000000 |
| 11011011111100011000000001111111110 | 00000111100000000000000000000000000 |
| 11010111111100011000000001111111110 | 00001111000000000000000000000000000 |
| 10001111111100011000000001111111110 | 01100110000000000000000000000000000 |
| 11001111111100011000000001111111110 | 00011110000000000000000000000000000 |
| 10101111111100011000000001111111110 | 01011010000000000000000000000000000 |
| 10011111111100011000000001111111110 | 01111000000000000000000000000000000 |
| 01011111111100011000000001111111110 | 11110000000000000000000000000000000 |
| 11011111111100011000000001010101000 | 00000000000000000000000000110000010 |
| 11011111111100011000000001110101000 | 00000000000000000000000000001100010 |
| 11011111111100011000000001111101000 | 00000000000000000000000000000011010 |

TABLE 10

Sync word pattern in state 2 (11011111111100011000000001111111110)

| Erroneous pattern | Squared Euclidian distance per bit |
|---|---|
| 11011111111100011000000001010100100 | 00000000000000000000000000110001010 |
| 11011111111100011000000001110100100 | 00000000000000000000000000001101010 |
| 11011111111100011000000001010010100 | 00000000000000000000000000110101000 |
| 11011111111100011000000000101010100 | 00000000000000000000000001100000000 |
| 11011111111100011000000001101010100 | 00000000000000000000000000011000000 |
| 11011111111100011000000001011010100 | 00000000000000000000000000111010000 |
| 11011111111100011000000001111010100 | 00000000000000000000000000000110000 |
| 11011111111100011000000001010110100 | 00000000000000000000000000110010100 |
| 11011111111100011000000001110110100 | 00000000000000000000000000001110100 |
| 11011111111100011000000001111110100 | 00000000000000000000000000000001100 |
| 11011111111100011000000001010101100 | 00000000000000000000000000110000101 |
| 11011111111100011000000001110101100 | 00000000000000000000000000001100101 |
| 11011111111100011000000001111101100 | 00000000000000000000000000000011101 |
| 11011111111100011000000001111111100 | 00000000000000000000000000000000011 |
| 11011111111100011000000001010101010 | 00000000000000000000000000110000001 |
| 11011111111100011000000001110101010 | 00000000000000000000000000001100001 |
| 11011111111100011000000001111101010 | 00000000000000000000000000000011001 |
| 11011111111100011000000001111111010 | 00000000000000000000000000000000111 |
| 11011111111100011000000000101010110 | 00000000000000000000000001100000011 |
| 11011111111100011000000001101010110 | 00000000000000000000000000011000011 |
| 11011111111100011000000001111010110 | 00000000000000000000000000000110011 |
| 11011111111100011000000001111110110 | 00000000000000000000000000000001111 |
| 11011111111100011000000001010101110 | 00000000000000000000000000110000110 |
| 11011111111100011000000001110101110 | 00000000000000000000000000001100110 |
| 11011111111100011000000001111101110 | 00000000000000000000000000000011110 |
| 11011111111100011000000000101011110 | 00000000000000000000000001100001100 |
| 11011111111100011000000001101011110 | 00000000000000000000000000011001100 |
| 11011111111100011000000001111011110 | 00000000000000000000000000000111100 |
| 11011111111100011000000001010111110 | 00000000000000000000000000110011000 |
| 11011111111100011000000001110111110 | 00000000000000000000000000001111000 |
| 11011111111100011000000000101111110 | 00000000000000000000000001100110000 |
| 11011111111100011000000001101111110 | 00000000000000000000000000011110000 |

TABLE 10-continued

Sync word pattern in state 2 (1101111111110001100000000001111111110)

| Erroneous pattern | Squared Euclidian distance per bit |
|---|---|
| 1101111111110001100000000001011111110 | 0000000000000000000000000111100000 |
| 1101111111110001100000000000111111110 | 0000000000000000000000000111000000 |
| 1101111111110001101000000001111111110 | 0000000000000000001111000000000000 |
| 1101111111110001100100000001111111110 | 0000000000000000000111000000000000 |
| 1101111111110001100010000001111111110 | 0000000000000000000111000000000000 |
| 1101111111110001101010000001111111110 | 0000000000000000001100110000000000 |
| 1101111111110001100001000001111111110 | 0000000000000000000111100000000000 |
| 1101111111110001100101000001111111110 | 0000000000000000000110011000000000 |

TABLE 11

Sync word pattern in state 2 (1101111111110001100000000001111111110)

| Erroneous pattern | Squared Euclidian distance per bit |
|---|---|
| 1101111111110001100001000101111111110 | 0000000000000000000001110000000000 |
| 1101111111110001100010100011111111110 | 0000000000000000000110010000000000 |
| 1101111111110001101010100011111111110 | 0000000000000000011000110000000000 |
| 1101111111110001100001001111111110 | 0000000000000000000001111000000000 |
| 1101111111110001100001010011111111110 | 0000000000000000000011001100000000 |
| 1101111111110001100101010011111111110 | 0000000000000000011000011000000000 |
| 1101111111110001100000000101111111110 | 0000000000000000000000111100000000 |
| 1101111111110001100001010111111111110 | 0000000000000000000110011000000000 |
| 1101111111110001100010101011111111110 | 0000000000000000011000011000000000 |
| 1101111111110001101010101011111111110 | 0000000000000000110000011000000000 |
| 1101111111110001100000000011111111110 | 0000000000000000000000001110000000 |
| 1101111111110001100001011111111110 | 0000000000000000000001100110000000 |
| 1101111111110001100010101111111110 | 0000000000000000000110000110000000 |
| 1101111111110001100101010111111111110 | 0000000000000000011000001100000000 |
| 1101111111110001100000000010101001 | 0000000000000000000000000110000011 |
| 1101111111110001100000000011101001 | 0000000000000000000000000001100011 |
| 1101111111110001100000000011111001 | 0000000000000000000000000000011011 |
| 1101111111110001100000000010101001 | 0000000000000000000000000000001100 |
| 1101111111110001100000000001101010101 | 0000000000000000000000000001100001 |
| 1101111111110001100000000001101010101 | 0000000000000000000000000000011001 |
| 1101111111110001100000000011111010101 | 0000000000000000000000000000110001 |
| 1101111111110001100000000011111010101 | 0000000000000000000000000001101 |
| 1101111111110001100000000010101011 | 0000000000000000000000000001100100 |
| 1101111111110001100000000011101011 | 0000000000000000000000000011001100 |
| 1101111111110001100000000011111101 | 0000000000000000000000000000011100 |
| 1101111111110001100000000011111101 | 0000000000000000000000000000000010 |
| 1101111111110001100000000011111111 | 0000000000000000000000000000000001 |
| 1111111111110001100000000011111110 | 0011100000000000000000000000000000 |
| 1101111111100110000000001111111110 | 0000000000111000000000000000000000 |
| 1101111111010110000000001111111110 | 0000000000011110000000000000000000 |
| 1101111111001110000000001111111110 | 0000000000000111000000000000000000 |
| 1101111111101100000000001111111110 | 0000000000001100110000000000000000 |
| 1101111111100011000000001111111110 | 0000000000000000111100000000000000 |
| 1101111111100011010000001111111110 | 0000000000000000110011000000000000 |
| 1101111111110001101000000011111111110 | 0000000000000001100001100000000000 |
| 1101111111110001101010001111111110 | 0000000000000011000001100000000000 |
| 1101111111110001101010101111111110 | 0000000000000001100000000110000000 |

Further, squared Euclidian distances per bit of erroneous patterns of a sync word pattern in an initial state S3 are as shown in Tables 12 to 14.

TABLE 12

Sync word pattern in state 3 (0001111111110001100000000001111111110)

| Erroneous pattern | Squared Euclidian distance per bit |
|---|---|
| 00011111111100010000000001111111110 | 0000000000000000111000000000000000 |
| 00011111111100001000000001111111110 | 0000000000000000111000000000000000 |
| 0000101010100001100000000001111111110 | 0001100000000011000000000000000000 |
| 0001101010100001100000000001111111110 | 0000001100000011000000000000000000 |
| 0001111010100001100000000001111111110 | 0000000011000011000000000000000000 |
| 0001111110100001100000000001111111110 | 0000000000110011000000000000000000 |
| 0001111111100001100000000001111111110 | 0000000000001111000000000000000000 |

TABLE 12-continued

Sync word pattern in state 3 (000111111111000110000000001111111110)

| Erroneous pattern | Squared Euclidian distance per bit |
|---|---|
| 000101010101000110000000001111111110 | 000001100000011000000000000000000000 |
| 000111010101000110000000001111111110 | 000000011000011000000000000000000000 |
| 000111110101000110000000001111111110 | 000000000110011000000000000000000000 |
| 000111111101000110000000001111111110 | 000000000001111000000000000000000000 |
| 000010101011000110000000001111111110 | 000110000001100000000000000000000000 |
| 000110101011000110000000001111111110 | 000001100001100000000000000000000000 |
| 000111101011000110000000001111111110 | 000000011001100000000000000000000000 |
| 000111111011000110000000001111111110 | 000000000111100000000000000000000000 |
| 000101010111000110000000001111111110 | 000011000011000000000000000000000000 |
| 000111010111000110000000001111111110 | 000000110011000000000000000000000000 |
| 000111110111000110000000001111111110 | 000000001111000000000000000000000000 |
| 000010101111000110000000001111111110 | 000110000110000000000000000000000000 |
| 000110101111000110000000001111111110 | 000001100110000000000000000000000000 |
| 000111101111000110000000001111111110 | 000000011110000000000000000000000000 |
| 000101011111000110000000001111111110 | 000011001100000000000000000000000000 |
| 000111011111000110000000001111111110 | 000000111100000000000000000000000000 |
| 000010111111000110000000001111111110 | 000110011000000000000000000000000000 |
| 000110111111000110000000001111111110 | 000001111000000000000000000000000000 |
| 000101111111000110000000001111111110 | 000011110000000000000000000000000000 |
| 000011111111000110000000001111111110 | 000111100000000000000000000000000000 |
| 000111111111000110000000001010101000 | 000000000000000000000000000110000010 |
| 000111111111000110000000001110101000 | 000000000000000000000000000001100010 |
| 000111111111000110000000001111101000 | 000000000000000000000000000000011010 |
| 000111111111000110000000001010100100 | 000000000000000000000000000110001010 |
| 000111111111000110000000001110100100 | 000000000000000000000000000001101010 |
| 000111111111000110000000001010010100 | 000000000000000000000000000110101000 |
| 000111111111000110000000000101010100 | 000000000000000000000000001100000000 |
| 000111111111000110000000001101010100 | 000000000000000000000000000011000000 |
| 000111111111000110000000001011010100 | 000000000000000000000000000111010000 |
| 000111111111000110000000001111010100 | 000000000000000000000000000000110000 |
| 000111111111000110000000001010110100 | 000000000000000000000000000110010100 |

TABLE 13

Sync word pattern in state 3 (000111111111000110000000001111111110)

| Erroneous pattern | Squared Euclidian distance per bit |
|---|---|
| 000111111111000110000000001110110100 | 000000000000000000000000000001110100 |
| 000111111111000110000000001111110100 | 000000000000000000000000000000001100 |
| 000111111111000110000000001010101100 | 000000000000000000000000000110000101 |
| 000111111111000110000000001110101100 | 000000000000000000000000000001100101 |
| 000111111111000110000000001111101100 | 000000000000000000000000000000011101 |
| 000111111111000110000000001111111100 | 000000000000000000000000000000000011 |
| 000111111111000110000000001010101010 | 000000000000000000000000000110000001 |
| 000111111111000110000000001110101010 | 000000000000000000000000000001100001 |
| 000111111111000110000000001111101010 | 000000000000000000000000000000011001 |
| 000111111111000110000000001111111010 | 000000000000000000000000000000000111 |
| 000111111111000110000000000101010110 | 000000000000000000000000001100000011 |
| 000111111111000110000000001101010110 | 000000000000000000000000000011000011 |
| 000111111111000110000000001111010110 | 000000000000000000000000000000110011 |
| 000111111111000110000000001111110110 | 000000000000000000000000000000001111 |
| 000111111111000110000000001010101110 | 000000000000000000000000000110000110 |
| 000111111111000110000000001110101110 | 000000000000000000000000000001100110 |
| 000111111111000110000000001111101110 | 000000000000000000000000000000011110 |
| 000111111111000110000000000101011110 | 000000000000000000000000001100001100 |
| 000111111111000110000000001101011110 | 000000000000000000000000000011001100 |
| 000111111111000110000000001111011110 | 000000000000000000000000000000111100 |
| 000111111111000110000000000101111110 | 000000000000000000000000001100011000 |
| 000111111111000110000000001101111110 | 000000000000000000000000000011110000 |
| 000111111111000110000000000101111110 | 000000000000000000000000001100110000 |
| 000111111111000110000000001101111110 | 000000000000000000000000000011110000 |
| 000111111111000110000000001011111110 | 000000000000000000000000000111100000 |
| 000111111111000110000000001111111110 | 000000000000000000000000001111000000 |
| 000111111111000110100000001111111110 | 000000000000000011110000000000000000 |
| 000111111111000110010000001111111110 | 000000000000000000111100000000000000 |
| 000111111111000110001000001111111110 | 000000000000000000001111000000000000 |
| 000111111111000110101000001111111110 | 000000000000000011001100000000000000 |
| 000111111111000110000100001111111110 | 000000000000000000001111000000000000 |
| 000111111111000110010100001111111110 | 000000000000000000110011000000000000 |
| 000111111111000110000010001111111110 | 000000000000000000001111000000000000 |
| 000111111111000110001010001111111110 | 000000000000000000001100110000000000 |

TABLE 13-continued

Sync word pattern in state 3 (000111111111000110000000001111111110)

| Erroneous pattern | Squared Euclidian distance per bit |
|---|---|
| 000111111111000110101010001111111110 | 000000000000000000011000011000000000 |
| 000111111111000110000001001111111110 | 000000000000000000000000111000000000 |
| 000111111111000110000101001111111110 | 000000000000000000000110011000000000 |
| 000111111111000110010101001111111110 | 000000000000000000011000011000000000 |
| 000111111111000110000000101111111110 | 000000000000000000000000111100000000 |
| 000111111111000110000010101111111110 | 000000000000000000000011001100000000 |

TABLE 14

Sync word pattern in state 3 (000111111111000110000000001111111110)

| Erroneous pattern | Squared Euclidian distance per bit |
|---|---|
| 000111111111000110001010101111111110 | 000000000000000000001100001100000000 |
| 000111111111000110101010101111111110 | 000000000000000000011000001100000000 |
| 000111111111000110000000011111111110 | 000000000000000000000000011110000000 |
| 000111111111000110000001011111111110 | 000000000000000000000000110011000000 |
| 000111111111000110000101011111111110 | 000000000000000000000110000110000000 |
| 000111111111000110010101011111111110 | 000000000000000000011000000110000000 |
| 000111111111000110000000001010101001 | 000000000000000000000000000110000011 |
| 000111111111000110000000001110101001 | 000000000000000000000000000001100011 |
| 000111111111000110000000001111101001 | 000000000000000000000000000000011011 |
| 000111111111000110000000001010101101 | 000000000000000000000000000001100000 |
| 000111111111000110000000001101010101 | 000000000000000000000000000000011000001 |
| 000111111111000110000000001111010101 | 000000000000000000000000000000110001 |
| 000111111111000110000000001111110101 | 000000000000000000000000000000001101 |
| 000111111111000110000000001010101101 | 000000000000000000000000000110000100 |
| 000111111111000110000000001110101101 | 000000000000000000000000000001100100 |
| 000111111111000110000000001111101101 | 000000000000000000000000000000011100 |
| 000111111111000110000000001111111101 | 000000000000000000000000000000000010 |
| 000111111111000110000000001111111111 | 000000000000000000000000000000000001 |
| 100111111111000110000000001111111110 | 111100000000000000000000000000000000 |
| 010111111111000110000000001111111110 | 011110000000000000000000000000000000 |
| 001111111111000110000000001111111110 | 001111000000000000000000000000000000 |
| 101111111111000110000000001111111110 | 110011000000000000000000000000000000 |
| 000111111111001110000000001111111110 | 000000000000111100000000000000000000 |
| 000111111111010110000000001111111110 | 000000000000011110000000000000000000 |
| 000111111111001110000000001111111110 | 000000000000001111000000000000000000 |
| 000111111111101110000000001111111110 | 000000000000110011000000000000000000 |
| 000111111111000111000000001111111110 | 000000000000000001111000000000000000 |
| 000111111111000111010000001111111110 | 000000000000000001100110000000000000 |
| 000111111111000111010100001111111110 | 000000000000000011000011000000000000 |
| 000111111111000111010101001111111110 | 000000000000000011000000110000000000 |
| 000111111111000111010101011111111110 | 000000000000000011000000000110000000 |

It was confirmed that a sync word pattern and an erroneous pattern thereof were at a squared Euclidian distance of more than 5 from the 16/18 code and no resetting was made in any wrong position. Therefore, a sync word can be detected with any error allowed by taking all erroneous pattern being at a squared Euclidian distance of less than 4 from a sync word pattern as sync words, and thus the probability of no detection can be reduced without any increased probability of erroneous detection.

Further, following conditions 4 to 6 are added to the aforementioned conditions 1 to 3 for the sync word:

Condition 4:

No signal of 1T should come before and after 9T in a sync word.

Condition 5:

There should exist more than 2T before and after any sync word. Thus, 9T is positioned near either end of a sync word.

Condition 6:

Susceptible to shift of a sync word, 9T should not be repeated 3 times in succession.

One sync word pattern shown in Table 15 can be set common to each of pairs S0 and S1, and S2 and S3.

TABLE 15

| Initial state | Sync pattern | Erroneous pattern | End state |
|---|---|---|---|
| S0, S1 | 111000000000110011111111100000000011 | 85 | S0 |
| S2, S3 | 110000000001100111111111100000000011 | 85 | S0 |

Figure 11:
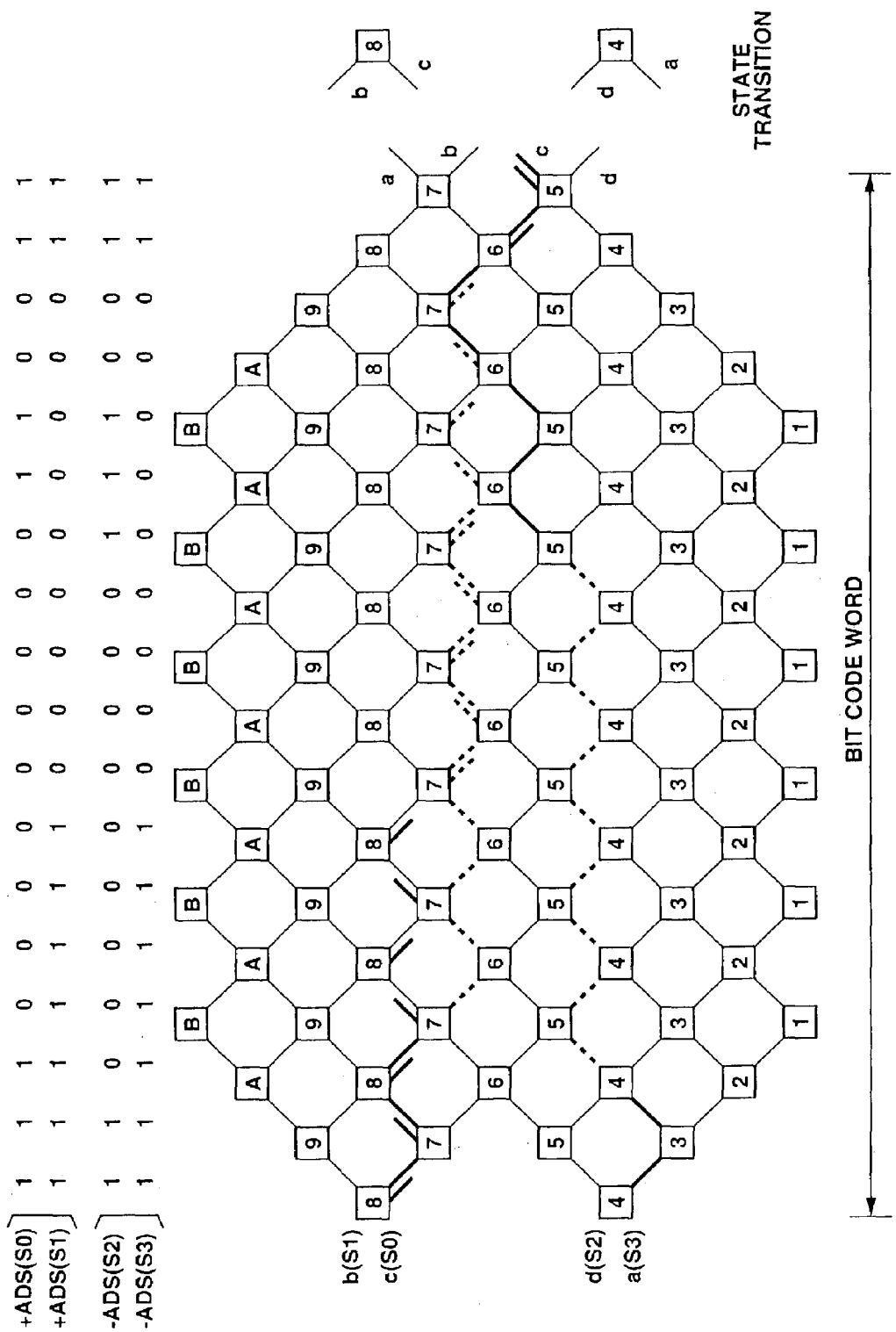
FIG. 11 shows a sync word pattern and a trellis diagram of a 16/18 (0, 7) code.
Figure 12:
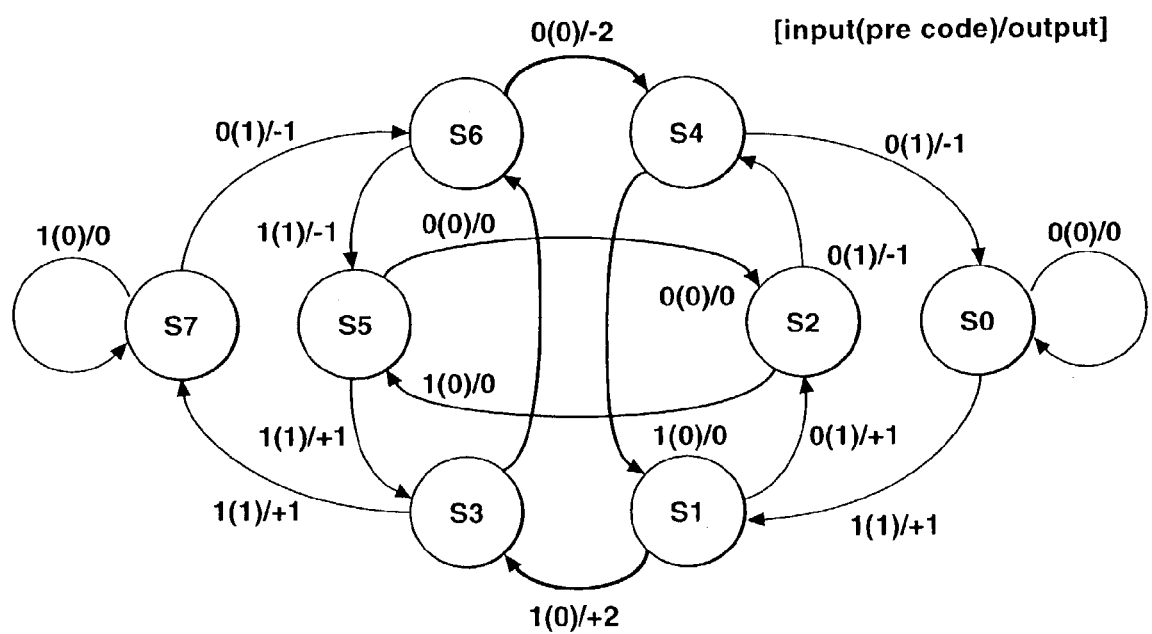
FIG. 12 is a state transition diagram of EPR4.
Figure 13:
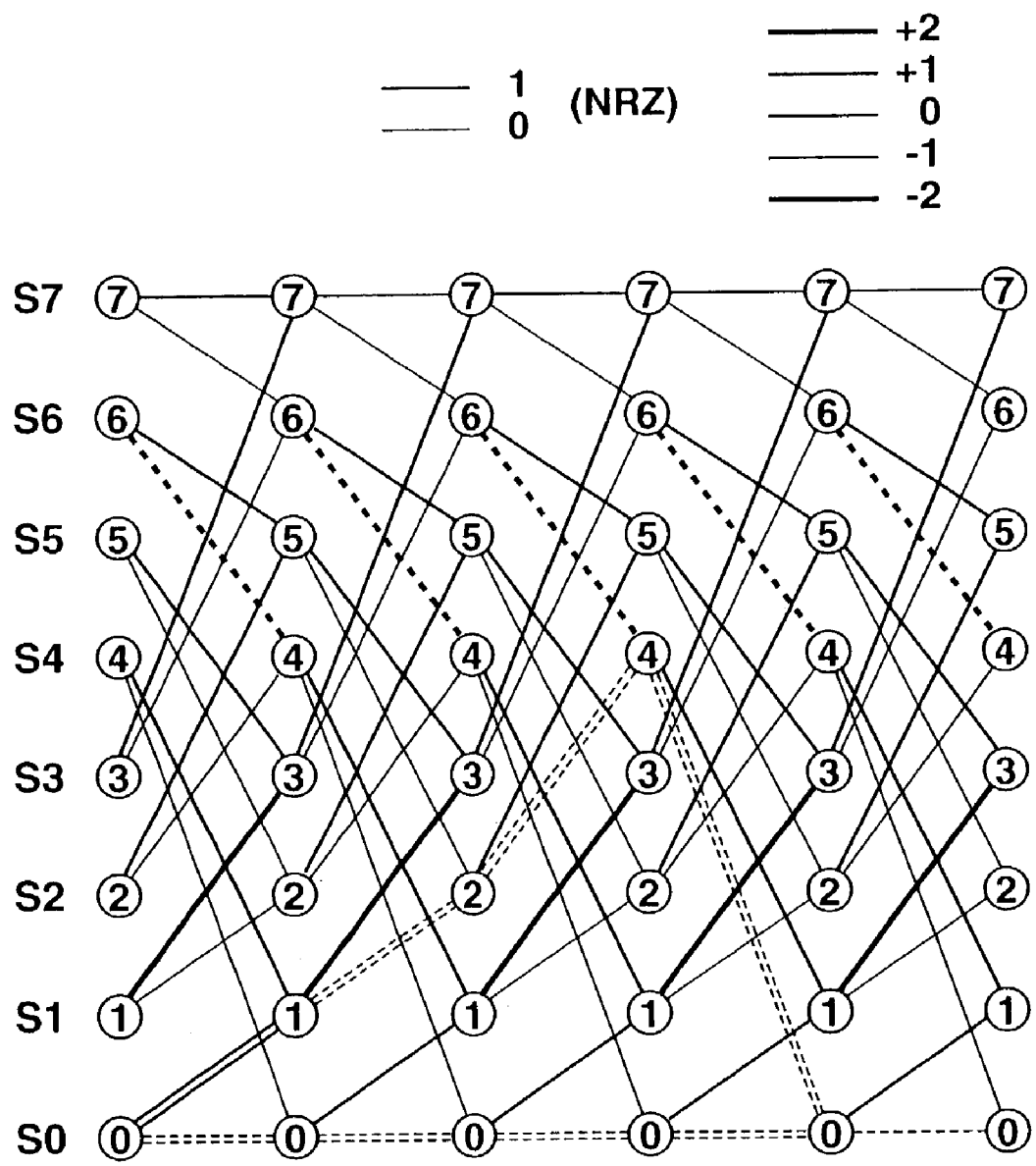
FIG. 13 is a trellis diagram of EPR4.

A sync word pattern and trellis diagram of a 16/18 (0, 7) code are shown in FIG. 11.

Squared Euclidian distances per bit of erroneous patterns of 2 kinds of sync word patterns shown in Table 15 are as follows.

That is, squared Euclidian distances per bit of erroneous patterns of a sync word pattern in the initial state S0 and S1 are as shown in Tables 16 and 17.

TABLE 16

| Sync word pattern in state 0 or 1 (1110000000001100111111111100000000011) | |
|---|---|
| Erroneous pattern | Squared Euclidian distance per bit |
| 1110000000001100101010101000000000011 | 0000000000000000001100000011000000000 |
| 1110000000001100101010111000000000011 | 0000000000000000001100001100000000000 |
| 1110000000001100101011111000000000011 | 0000000000000000001100110000000000000 |
| 1110000000001100101111111000000000011 | 0000000000000000001111000000000000000 |
| 1110000000001100010101010000000000011 | 0000000000000000011000000011000000000 |
| 1110000000001100010101011000000000011 | 0000000000000000011000001100000000000 |
| 1110000000001100010101111000000000011 | 0000000000000000011000011000000000000 |
| 1110000000001100010111111000000000011 | 0000000000000000011001100000000000000 |
| 1110000000001100011111111000000000011 | 0000000000000000011110000000000000000 |
| 1110000000001000111111111000000000011 | 0000000000000111000000000000000000000 |
| 1110000000000100111111111100000000011 | 0000000000001111000000000000000000000 |
| 0100000000001100111111111100000000011 | 1100110000000000000000000000000000000 |
| 1100000000001100111111111100000000011 | 0011110000000000000000000000000000000 |
| 1010000000001100111111111100000000011 | 0111100000000000000000000000000000000 |
| 0110000000001100111111111100000000011 | 1111000000000000000000000000000000000 |
| 1110000000001100111111111100000000010 | 0000000000000000000000000000000000001 |
| 1110000000001100111111111100000000001 | 0000000000000000000000000000000000011 |
| 1110000000001100110101010000000000011 | 0000000000000000000110000001100000000 |
| 1110000000001100111010100000000000011 | 0000000000000000000001100001100000000 |
| 1110000000001100111110101000000000011 | 0000000000000000000000011001100000000 |
| 1110000000001100111111101000000000011 | 0000000000000000000000000111100000000 |
| 1110000000001100110101010000000000011 | 0000000000000000000110000110000000000 |
| 1110000000001100111110101000000000011 | 0000000000000000000001100110000000000 |
| 1110000000001100111111101000000000011 | 0000000000000000000000001111000000000 |
| 1110000000001100110101011000000000011 | 0000000000000000000110000110000000000 |
| 1110000000001100111010101000000000011 | 0000000000000000000001100110000000000 |
| 1110000000001100111110101000000000011 | 0000000000000000000000011110000000000 |
| 1110000000001100111010111000000000011 | 0000000000000000000001100110000000000 |
| 1110000000001100111110111000000000011 | 0000000000000000000000011110000000000 |
| 1110000000001100110101111000000000011 | 0000000000000000000001100110000000000 |
| 1110000000001100111011111000000000011 | 0000000000000000000001111000000000000 |
| 1110000000001100110111111000000000011 | 0000000000000000000111100000000000000 |
| 1110000000001100111011111000000000011 | 0000000000000000001111000000000000000 |
| 1110000000001100111111111110000000011 | 0000000000000000000000000000011110000000 |
| 1110000000001100111111111101000000011 | 0000000000000000000000000000001111000000 |
| 1110000000001100111111111100100000011 | 0000000000000000000000000000000111100000 |
| 1110000000001100111111111110100000011 | 0000000000000000000000000000011001100000 |
| 1110000000001100111111111100010000011 | 0000000000000000000000000000000011110000 |
| 1110000000001100111111111101010000011 | 0000000000000000000000000000001100110000 |
| 1110000000001100111111111100001000011 | 0000000000000000000000000000000001111000 |
| 1110000000001100111111111100101000011 | 0000000000000000000000000000000110011000 |
| 1110000000001100111111111110101000011 | 0000000000000000000000000000011000011000 |
| 1110000000001100111111111100000100011 | 0000000000000000000000000000000000111100 |

TABLE 17

| Sync word pattern in state 0 or 1 (1110000000001100111111111100000000011) | |
|---|---|
| Erroneous pattern | Squared Euclidian distance per bit |
| 1110000000001100111111111100010100011 | 0000000000000000000000000000000011001100 |
| 1110000000001100111111111101010100011 | 0000000000000000000000000000001100001100 |
| 1110000000001100111111111100000010011 | 0000000000000000000000000000000000011110 |
| 1110000000001100111111111100001010011 | 0000000000000000000000000000000001100110 |
| 1110000000001100111111111100101010011 | 0000000000000000000000000000000110000110 |
| 1110000000001100111111111110101010011 | 0000000000000000000000000000011000000110 |
| 1110000000001100111111111100000001011 | 0000000000000000000000000000000000001111 |
| 1110000000001100111111111100000101011 | 0000000000000000000000000000000000110011 |
| 1110000000001100111111111100010101011 | 0000000000000000000000000000000011000011 |
| 1110000000001100111111111101010101011 | 0000000000000000000000000000001100000011 |
| 1110000000001100111111111100000000111 | 0000000000000000000000000000000000000111 |
| 1110000000001100111111111100000010111 | 0000000000000000000000000000000000011001 |
| 1110000000001100111111111100001010111 | 0000000000000000000000000000000001100001 |
| 1110000000001100111111111100101010111 | 0000000000000000000000000000000110000001 |
| 1110000000001100111111111110101010111 | 0000000000000000000000000000011000000001 |
| 1111000000001100111111111100000000011 | 0001111000000000000000000000000000000000 |
| 1110100000001100111111111100000000011 | 0000111100000000000000000000000000000000 |
| 1110010000001100111111111100000000011 | 0000011110000000000000000000000000000000 |
| 1110101000001100111111111100000000011 | 0001100110000000000000000000000000000000 |
| 1110001000001100111111111100000000011 | 0000001111000000000000000000000000000000 |
| 1110101000001100111111111100000000011 | 0000110011000000000000000000000000000000 |
| 1110000100001100111111111100000000011 | 0000000111100000000000000000000000000000 |

TABLE 17-continued

Sync word pattern in state 0 or 1 (1110000000011001111111100000000011)

| Erroneous pattern | Squared Euclidian distance per bit |
|---|---|
| 1110010100011001111111100000000011 | 0000011001100000000000000000000000 |
| 1111010100011001111111100000000011 | 0001100001100000000000000000000000 |
| 1110000010011001111111100000000011 | 0000000011110000000000000000000000 |
| 1110001010011001111111100000000011 | 0000001100110000000000000000000000 |
| 1110101010011001111111100000000011 | 0000110000110000000000000000000000 |
| 1110000000011001111111100000000011 | 0000000001111000000000000000000000 |
| 1110000101011001111111100000000011 | 0000000110011000000000000000000000 |
| 1110010101011001111111100000000011 | 0000011000011000000000000000000000 |
| 1111010101011001111111100000000011 | 0001100000110000000000000000000000 |
| 1110000000101001111111100000000011 | 0000000000111100000000000000000000 |
| 1110000010101001111111100000000011 | 0000000011001100000000000000000000 |
| 1110001010101001111111100000000011 | 0000001100001100000000000000000000 |
| 1110101010101001111111100000000011 | 0000110000011000000000000000000000 |
| 1110000000011101111111100000000011 | 0000000000111100000000000000000000 |
| 1110000001011101111111100000000011 | 0000000011001100000000000000000000 |
| 1110000101011101111111100000000011 | 0000001100001100000000000000000000 |
| 1110010101011101111111100000000011 | 0000011000001100000000000000000000 |
| 1111010101011101111111100000000011 | 0001100000011000000000000000000000 |
| 1110000000001101111111100000000011 | 0000000000000111100000000000000000 |
| 1110000000001101111111100000000011 | 0000000000000011110000000000000000 |

Also, squared Euclidian distances per bit of erroneous patterns of a sync word pattern in the initial state S2 and S3 are as shown in Tables 18 and 19.

TABLE 18

Sync word pattern in state 2 or 3 (1100000000011100111111111100000000011)

| Erroneous pattern | Squared Euclidian distance per bit |
|---|---|
| 1100000000011100101010101000000000011 | 0000000000000000011000000110000000000 |
| 1100000000011100101010111000000000011 | 0000000000000000011000011000000000000 |
| 1100000000011100101011110000000000011 | 0000000000000000011001100000000000000 |
| 1100000000011100101111110000000000011 | 0000000000000000011110000000000000000 |
| 1100000000011100010101000000000000011 | 0000000000000000011000000110000000000 |
| 1100000000011100010101011000000000011 | 0000000000000000011000001100000000000 |
| 1100000000011100010101111000000000011 | 0000000000000000011000011000000000000 |
| 1100000000011100010111111000000000011 | 0000000000000000011001100000000000000 |
| 1100000000011100011111111000000000011 | 0000000000000000011110000000000000000 |
| 1100000000010001111111100000000011 | 0000000000110011000000000000000000 |
| 1100000000110001111111100000000011 | 0000000000001111000000000000000000 |
| 1100000000101001111111100000000011 | 0000000000111100000000000000000000 |
| 1100000000110011111111100000000011 | 0000000000011110000000000000000000 |
| 1000000000011001111111100000000011 | 0111100000000000000000000000000000 |
| 0100000000011001111111100000000011 | 1111000000000000000000000000000000 |
| 1100000000011001111111100000000010 | 0000000000000000000000000000000001 |
| 1100000000011001111111100000000001 | 0000000000000000000000000000000011 |
| 1100000000011001101010100000000011 | 0000000000000000011000000110000000 |
| 1100000000011001110101000000000011 | 0000000000000000001100001100000000 |
| 1100000000011001111110100000000011 | 0000000000000000000001100110000000 |
| 1100000000011001111111000000000011 | 0000000000000000000000001111000000 |
| 1100000000011001101010100000000011 | 0000000000000000011000011000000000 |
| 1100000000011001111010100000000011 | 0000000000000000001100110000000000 |
| 1100000000011001111111010000000011 | 0000000000000000000001111000000000 |
| 1100000000011001101010110000000011 | 0000000000000000011000110000000000 |
| 1100000000011001110101100000000011 | 0000000000000000001100110000000000 |
| 1100000000011001111110100000000011 | 0000000000000000000011110000000000 |
| 1100000000011001101011110000000011 | 0000000000000000011001100000000000 |
| 1100000000011001111011110000000011 | 0000000000000000001110000000000000 |
| 1100000000011001101011110000000011 | 0000000000000000011001100000000000 |
| 1100000000011001110111110000000011 | 0000000000000000001110000000000000 |
| 1100000000011001101111110000000011 | 0000000000000000011100000000000000 |
| 1100000000011001111111100000000011 | 0000000000000000000111000000000000 |
| 1100000000011001111111101000000011 | 0000000000000000000000001110000000 |
| 1100000000011001111111100100000011 | 0000000000000000000000000111100000 |
| 1100000000011001111111101010000011 | 0000000000000000000000011001100000 |
| 1100000000011001111111100010000011 | 0000000000000000000000000011110000 |
| 1100000000011001111111101010000011 | 0000000000000000000000001100110000 |

TABLE 18-continued

Sync word pattern in state 2 or 3 (110000000001110011111111100000000011)

| Erroneous pattern | Squared Euclidian distance per bit |
|---|---|
| 110000000001110011111111100001000011 | 000000000000000000000000000001111000 |
| 110000000001110011111111100101000011 | 000000000000000000000000000110011000 |
| 110000000001110011111111110101000011 | 000000000000000000000000011000011000 |
| 110000000001110011111111100000100011 | 000000000000000000000000000000111100 |

TABLE 19

Sync word pattern in state 2 or 3 (110000000001110011111111100000000011)

| Erroneous pattern | Squared Euclidian distance per bit |
|---|---|
| 110000000001110011111111100010100011 | 000000000000000000000000000011001100 |
| 110000000001110011111111101010100011 | 000000000000000000000000001100001100 |
| 110000000001110011111111100000010011 | 000000000000000000000000000000011110 |
| 110000000001110011111111100001010011 | 000000000000000000000000000001100110 |
| 110000000001110011111111100101010011 | 000000000000000000000000000110000110 |
| 110000000001110011111111110101010011 | 000000000000000000000000011000000110 |
| 110000000001110011111111100000001011 | 000000000000000000000000000000001111 |
| 110000000001110011111111100000101011 | 000000000000000000000000000000110011 |
| 110000000001110011111111100010101011 | 000000000000000000000000000011000011 |
| 110000000001110011111111101010101011 | 000000000000000000000000001100000011 |
| 110000000001110011111111100000000111 | 000000000000000000000000000000000111 |
| 110000000001110011111111100000010111 | 000000000000000000000000000000011001 |
| 110000000001110011111111100001010111 | 000000000000000000000000000001100001 |
| 110000000001110011111111100101010111 | 000000000000000000000000000110000001 |
| 110000000001110011111111110101010111 | 000000000000000000000000011000000001 |
| 111000000001110011111111100000000011 | 001111000000000000000000000000000000 |
| 110100000001110011111111100000000011 | 000111100000000000000000000000000000 |
| 110010000001110011111111100000000011 | 000011110000000000000000000000000000 |
| 111010000001110011111111100000000011 | 001100110000000000000000000000000000 |
| 110001000001110011111111100000000011 | 000001111000000000000000000000000000 |
| 110101000001110011111111100000000011 | 000110011000000000000000000000000000 |
| 110000100001110011111111100000000011 | 000000111100000000000000000000000000 |
| 110010100001110011111111100000000011 | 000011001100000000000000000000000000 |
| 111010100001110011111111100000000011 | 001100001100000000000000000000000000 |
| 110000010001110011111111100000000011 | 000000011110000000000000000000000000 |
| 110001010001110011111111100000000011 | 000001100110000000000000000000000000 |
| 110101010001110011111111100000000011 | 000110000110000000000000000000000000 |
| 110000001001110011111111100000000011 | 000000001111000000000000000000000000 |
| 110000101001110011111111100000000011 | 000000110011000000000000000000000000 |
| 110010101001110011111111100000000011 | 000011000011000000000000000000000000 |
| 111010101001110011111111100000000011 | 001100000011000000000000000000000000 |
| 110000000101110011111111100000000011 | 000000000111100000000000000000000000 |
| 110000010101110011111111100000000011 | 000000011001100000000000000000000000 |
| 110001010101110011111111100000000011 | 000001100011000000000000000000000000 |
| 110101010101110011111111100000000011 | 000110000011000000000000000000000000 |
| 110000000011110011111111100000000011 | 000000000001111000000000000000000000 |
| 110000000101111011111111100000000011 | 000000000110011000000000000000000000 |
| 110000010101111011111111100000000011 | 000000011000011000000000000000000000 |
| 110001010101111011111111100000000011 | 000001100000110000000000000000000000 |
| 111010101011111011111111100000000011 | 001100000001100000000000000000000000 |
| 110000000011101111111111100000000011 | 000000000000111100000000000000000000 |
| 110000000001101111111111100000000011 | 000000000000001111000000000000000000 |

INDUSTRIAL APPLICATION

As having been described in the foregoing, the present invention permits to distinguish a block sync signal from a code sequence and recognize, at the time of data reading or reception, the head of a block composed of a plurality of code words with the use of a block sync signal added to the head of a block composed of a plurality of code words and in which nine same bits are repeated in succession more than once when the maximum length of the succession of same bits in a code sequence is set as Tmax=8.

Also, the present invention permits to detect a sync word with any error being allowed by regarding all erroneous patterns having a squared Euclidian distance of less than 4 between sync word patterns as sync words, and reduce the probability of no detection without any increased probability of erroneous detection.

Also, the present invention permits to reduce the probability of erroneous detection of a block sync signal by taking block sync signals different in start-point state from each other as being unique, respectively, and as being identical in end-point state to each other in a detection trellis having a time-varying structure and used for maximum likelihood detection of a code sequence including the block sync signal from an output sequence of a transmission channel and detecting a block sync signal with the use of a window signal having a detection window that is based on a detected sync signal.

Also, the present invention permits to make a stable metric detection by taking block sync signals different in start-point state from each other as being unique, respectively, and as being identical in end-point state to each other in a detection trellis having a time-varying structure and used for maximum likelihood detection of a code sequence including the block sync signal from an output sequence of a transmission channel, detecting the block sync signal and the start-point state of a TCPR Viterbi detector in the detection trellis with the use of the block sync signal according to the uniqueness of the detected block sync signal, and presetting a branch metric after detection of the block sync signal.

The invention claimed is:

1. A code sequence including a block sync signal added to the head of a block composed of a plurality of code words,
   wherein the block sync signal has more than one succession of 9 same bits when the maximum length of a succession of same bits in a code sequence is Tmax=8,
   wherein when a code word is laid adjacent to either end of the data block, the block sync signal has no succession of more than 9 same bits between the code word laid just before the block sync signal and the block sync signal itself and between the block sync signal and the code word laid just after the block sync signal,
   wherein the block sync signal follows a time-varying structure of a detection trellis used for maximum likelihood detection of a code sequence including the block sync signal from an output sequence of a transmission channel,
   wherein the length of the block sync signal is 36 bits, an integer multiple of a code length, and
   wherein the same block sync signal includes three successions of 9 same bits.

2. The code sequence as set forth in claim 1, wherein the same block sync signal includes two successions of 3 same bits.

3. The code sequence as set forth in claim 2, wherein in the same block sync signal, a succession of 9 same bits has two or more same bits laid before and after it, respectively.

4. The code sequence as set forth in claim 3, wherein eight or less same bits are laid before and after the block sync signal, respectively.

5. The code sequence as set forth in claim 1, wherein in the detection trellis, block signals different in start-point state from each other are unique, respectively, and identical in end-point state to each other.

6. A data transmission method comprising:
   transmitting data with a block sync signal added to the head of a block composed of a plurality of code words,
   wherein in a detection trellis having a time-varying structure and used for maximum likelihood detection of a code sequence including the block sync signal from an output sequence of a transmission channel, block sync signals different in start-point state from each other are unique, respectively, and identical in end-point state to each other, and
   wherein in the detection trellis, when a code sequence including a block sync signal is detected from the transmission-channel output sequence by a non-time-varying detection method, even any erroneous sync signal caused by one erroneous event is detected as the block sync signal.

7. The method as set forth in claim 6, wherein in the detection trellis, block sync signals different in start-point state from each other are identical to each other when they are identical in ADS (alternating digital sum) to each other.

8. A player in which a code sequence including a transmitted sync signal is detected from an output sequence of a transmission channel having a predetermined characteristic, the player comprising:
   a non-time-varying detection means for detecting a code sequence including a block sync signal from an output sequence of a transmission channel;
   a sync signal detection means for detecting a block sync signal from an output from the non-time-varying detection means and outputting the information;
   a Viterbi detection means initialized with a block sync signal information output from the sync signal detection means to make Viterbi detection of a code sequence including a block sync signal from the transmission-channel output sequence with the use of a detection trellis having a time-varying structure; and
   a window signal generation means for generating a window signal having a block sync signal detection window that is based on a block sync signal detected by the sync signal detection means and a detection output from the Viterbi detection means;
   the sync signal detection means detecting a block sync signal with the use of the window signal generated by the window signal generation means.

9. The player as set forth in claim 8, wherein in a detection trellis having a time-varying structure and used for maximum likelihood detection of a code sequence including the block sync signal from an output sequence of a transmission channel, block sync signals different in start-point state from each other are unique, respectively, and identical in end-point state to each other; and
   the sync signal detecting means detects a block sync signal and the start-point state of the block sync signal in the detection trellis with the use of the block sync signal according to the uniqueness of the detected block sync signal, and presets a branch metric after detection of the block sync signal.

10. A block sync signal detection method of detecting a block sync signal transmitted as an addition to the head of a block composed of a plurality of code words, comprising:
    detecting a code sequence including a block sync signal from an output sequence of a transmission channel by non-time-varying detection means;
    detecting a block sync signal from an output from the non-time-varying detection means and outputting the information;
    detecting a code sequence including a block sync signal from the transmission channel output sequence with the use of a detection trellis having a time-varying structure by a Viterbi detection means;
    generating a window signal having a block sync signal detection window from a sync signal and an output from the Viterbi detection means; and
    detecting a block sync signal with the use of the window signal by the sync detection means.

11. The block sync signal detection method of claim 10, further comprising:
    detecting a block sync signal and the start-point state of the block sync signal in the detection trellis with the use if the block sync signal according to the uniqueness of the detected block sync signal; and
    presetting a branch metric after detection of the block sync signal.

12. The code sequence of claim 1, wherein the at least three succession of 9 same bits includes at least one succession having bits of 1 and at least one succession having bits of 0.

* * * * *